United States Patent
Ebeling et al.

(10) Patent No.: US 9,203,397 B1
(45) Date of Patent: Dec. 1, 2015

(54) DELAYING START OF USER DESIGN EXECUTION

(71) Applicant: Altera Corporation, San Jose, CA (US)

(72) Inventors: Christopher D. Ebeling, San Jose, CA (US); Trevis Chandler, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/716,096

(22) Filed: Dec. 15, 2012

Related U.S. Application Data

(60) Provisional application No. 61/576,972, filed on Dec. 16, 2011, provisional application No. 61/620,413, filed on Apr. 4, 2012, provisional application No. 61/649,877, filed on May 21, 2012, provisional application No. 61/718,584, filed on Oct. 25, 2012.

(51) Int. Cl.
*G06F 17/50* (2006.01)
*H03K 17/22* (2006.01)

(52) U.S. Cl.
CPC ........................................ *H03K 17/22* (2013.01)

(58) Field of Classification Search
CPC . G06F 17/5027; G06F 17/50; G06F 17/5045; G06F 17/505; G06F 17/5054; G06F 2217/08; H03K 19/17708; G05B 2219/25268
USPC .......................................... 716/100, 116, 117
See application file for complete search history.

(56) References Cited

U.S. PATENT DOCUMENTS

| | | | |
|---|---|---|---|
| 2,936,118 A * | 5/1960 | Greene et al. ................. | 712/245 |
| 4,873,459 A | 10/1989 | El Gamal et al. | |
| 5,021,690 A | 6/1991 | Linz | |
| 5,426,378 A | 6/1995 | Ong | |
| 5,589,782 A | 12/1996 | Sharpe-Geisler | |
| 5,596,743 A | 1/1997 | Bhat et al. | |
| 5,600,263 A | 2/1997 | Trimberger et al. | |
| 5,610,829 A | 3/1997 | Trimberger | |
| 5,629,637 A | 5/1997 | Trimberger et al. | |
| 5,640,106 A | 6/1997 | Erickson et al. | |
| 5,692,147 A | 11/1997 | Larsen et al. | |
| 5,701,441 A | 12/1997 | Trimberger | |
| 5,737,235 A | 4/1998 | Kean et al. | |
| 5,761,483 A | 6/1998 | Trimberger | |

(Continued)

OTHER PUBLICATIONS

Portions of prosecution history of U.S. Appl. No. 10/882,583, Aug. 21, 2006, Schmit, Herman, et al.

(Continued)

*Primary Examiner* — Vuthe Siek

(57) ABSTRACT

For an integrated circuit (IC) that is designed to execute user defined operations after initialization, a sequencing circuitry in the IC that delays the start of the user design execution until a set of initial condition has been computed and propagated is provided. The sequencing holds the first group of circuits at an initial state while a second group of circuits computes and propagates a set of initial conditions based at least partly on the initial state of the first group of circuits. The circuits in the first group when being held disregard their inputs and do not change their outputs. The first group of circuits is released from its initial state after the second group of circuits has completed computation and propagation of the set of initial conditions. The circuits in the first group when released are freed to store or clock-in new inputs and produce new outputs in order to perform the user defined operations in conjunction with the second group of circuits.

20 Claims, 23 Drawing Sheets

(56) References Cited

U.S. PATENT DOCUMENTS

| | | |
|---|---|---|
| 5,815,726 A | 9/1998 | Cliff |
| 5,825,662 A | 10/1998 | Trimberger |
| 5,920,712 A | 7/1999 | Kuijsten |
| 5,982,655 A | 11/1999 | Doyle |
| 6,018,559 A | 1/2000 | Azegami et al. |
| 6,020,758 A | 2/2000 | Patel et al. |
| 6,091,263 A | 7/2000 | New et al. |
| 6,184,707 B1 | 2/2001 | Norman et al. |
| 6,255,849 B1 | 7/2001 | Mohan |
| 6,292,019 B1 | 9/2001 | New et al. |
| 6,348,813 B1 | 2/2002 | Agrawal et al. |
| 6,404,224 B1 | 6/2002 | Azegami et al. |
| 6,430,736 B1 | 8/2002 | Levi et al. |
| 6,480,954 B2 | 11/2002 | Trimberger et al. |
| 6,487,709 B1 | 11/2002 | Keller et al. |
| 6,496,918 B1 | 12/2002 | Dehon et al. |
| 6,515,505 B1 | 2/2003 | Rees |
| 6,515,509 B1 | 2/2003 | Baxter |
| 6,529,040 B1 | 3/2003 | Carberry et al. |
| 6,603,330 B1 | 8/2003 | Snyder |
| 6,642,763 B2 | 11/2003 | Dike |
| 6,668,237 B1 | 12/2003 | Guccione et al. |
| 6,717,436 B2 | 4/2004 | Kress et al. |
| 6,829,756 B1 | 12/2004 | Trimberger |
| 6,831,479 B2 | 12/2004 | Lo |
| 6,838,902 B1 | 1/2005 | Elftmann et al. |
| 6,894,527 B1 | 5/2005 | Donlin et al. |
| 6,898,776 B1 * | 5/2005 | Jacobson et al. ............... 716/117 |
| 6,920,627 B2 | 7/2005 | Blodget et al. |
| 6,924,663 B2 | 8/2005 | Masui et al. |
| 6,992,505 B1 | 1/2006 | Zhou |
| 7,064,577 B1 | 6/2006 | Lee |
| 7,109,752 B1 | 9/2006 | Schmit et al. |
| 7,116,131 B1 | 10/2006 | Chirania et al. |
| 7,126,372 B2 | 10/2006 | Vadi et al. |
| 7,126,373 B1 | 10/2006 | Schmit et al. |
| 7,129,746 B1 | 10/2006 | Balasubramanian et al. |
| 7,138,827 B1 | 11/2006 | Trimberger |
| 7,157,933 B1 | 1/2007 | Schmit et al. |
| 7,167,025 B1 | 1/2007 | Schmit et al. |
| 7,193,440 B1 | 3/2007 | Schmit et al. |
| 7,224,181 B1 | 5/2007 | Schmit et al. |
| 7,276,933 B1 | 10/2007 | Teig et al. |
| 7,317,331 B2 | 1/2008 | Teig et al. |
| 7,408,382 B2 | 8/2008 | Schmit et al. |
| 7,420,389 B2 | 9/2008 | Schmit et al. |
| 7,425,841 B2 | 9/2008 | Schmit et al. |
| 7,439,766 B2 | 10/2008 | Schmit et al. |
| 7,525,342 B2 | 4/2009 | Teig et al. |
| 7,532,032 B2 | 5/2009 | Schmit et al. |
| 7,616,027 B2 | 11/2009 | Schmit et al. |
| 7,656,188 B2 | 2/2010 | Teig et al. |
| 7,667,486 B2 | 2/2010 | Schmit et al. |
| 7,746,111 B1 | 6/2010 | Gaide et al. |
| 7,779,380 B2 | 8/2010 | Honda |
| 7,822,881 B2 | 10/2010 | Vorbach et al. |
| 7,872,496 B2 | 1/2011 | Schmit et al. |
| 7,948,266 B2 | 5/2011 | Schmit et al. |
| 8,112,468 B1 * | 2/2012 | Redgrave et al. ............. 708/625 |
| 8,183,882 B2 | 5/2012 | Teig et al. |
| 8,193,830 B2 | 6/2012 | Schmit et al. |
| 8,305,110 B2 | 11/2012 | Schmit et al. |
| 8,638,119 B2 | 1/2014 | Schmit et al. |
| 2002/0089349 A1 | 7/2002 | Barbier et al. |
| 2002/0125914 A1 | 9/2002 | Kim |
| 2002/0157071 A1 | 10/2002 | Schiefele et al. |
| 2002/0169990 A1 | 11/2002 | Sherburne, Jr. |
| 2004/0103265 A1 | 5/2004 | Smith |
| 2004/0113655 A1 | 6/2004 | Curd et al. |
| 2004/0222817 A1 | 11/2004 | Madurawe |
| 2004/0225980 A1 | 11/2004 | Cappelli et al. |
| 2005/0134308 A1 | 6/2005 | Okada et al. |
| 2005/0246520 A1 | 11/2005 | Vadi et al. |
| 2007/0143577 A1 | 6/2007 | Smith |
| 2007/0257701 A1 * | 11/2007 | Bancel et al. .................. 326/38 |
| 2009/0172351 A1 | 7/2009 | Vorbach et al. |
| 2013/0099819 A1 | 4/2013 | Schmit et al. |
| 2013/0135008 A1 | 5/2013 | Zhang et al. |

OTHER PUBLICATIONS

Portions of prosecution history of U.S. Appl. No. 11/565,592, Jun. 27, 2008, Schmit, Herman, et al.

Portions of prosecution history of U.S. Appl. No. 10/883,276, Apr. 24, 2006, Schmit Herman, et al.

Portions of prosecution history of U.S. Appl. No. 11/467,918, Dec. 31, 2008, Schmit, Herman, et al.

Portions of prosecution history of U.S. Appl. No. 10/883,486, Aug. 12, 2008, Schmit, Herman, et al.

Portions of prosecution history of U.S. Appl. No. 12/200,867, Dec. 3, 2010, Schmit, Herman, et al.

Portions of prosecution history of U.S. Appl. No. 12/965,812, May 7, 2012, Schmit, Herman, et al.

Portions of prosecution history of U.S. Appl. No. 13/476,203, Sep. 16, 2013, Schmit, Herman, et al.

Portions of prosecution history of U.S. Appl. No. 10/882,946, Sep. 28, 2006, Schmit, Herman, et al.

Portions of prosecution history of U.S. Appl. No. 11/617,671, Jun. 23, 2009, Schmit, Herman, et al.

Portions of prosecution history of U.S. Appl. No. 10/882,839, Sep. 13, 2006, Schmit, Herman, et al.

Portions of prosecution history of U.S. Appl. No. 11/535,058, Jul. 10, 2008, Schmit, Herman, et al.

Portions of prosecution history of U.S. Appl. No. 10/883,051, Sep. 7, 2006, Schmit, Herman, et al.

Portions of prosecution history of U.S. Appl. No. 11/608,790, Sep. 30, 2009, Schmit, Herman, et al.

Portions of prosecution history of U.S. Appl. No. 12/685,673, Apr. 8, 2011, Schmit, Herman, et al.

Portions of prosecution history of U.S. Appl. No. 13/083,491, Oct. 10, 2012, Schmit, Herman, et al.

Portions of prosecution history of U.S. Appl. No. 13/621,145, Jul. 1, 2014, Schmit, Herman, et al.

Portions of prosecution history of U.S. Appl. No. 11/081,877, Oct. 10, 2007, Teig, Steven, et al.

Portions of prosecution history of U.S. Appl. No. 11/871,944, Sep. 14, 2009, Teig, Steven, et al.

Portions of prosecution history of U.S. Appl. No. 12/644,008, Apr. 13, 2012, Teig, Steven, et al.

Portions of prosecution history of U.S. Appl. No. 11/082,196, Aug. 10, 2007, Teig, Steven, et al.

Portions of prosecution history of U.S. Appl. No. 11/840,963, Dec. 15, 2008, Teig, Steven, et al.

Portions of prosecution history of U.S. Appl. No. 11/082,201, Jan. 4, 2007, Schmit, Herman, et al.

Portions of prosecution history of U.S. Appl. No. 11/733,158, May 30, 2008, Schmit, Herman, et al.

Author Unknown, "Unifying Sequential and Spatial Computing with a Single Instruction Set Architecture," ISCA '04, Jun. 19-23, 2004, 10 pages, ACM, Munchen, Oberbayern, Germany.

Butts, M., "Future Directions of Dynamically Reprogrammable Systems," IEEE 1995 Custom Integrated Circuits Conference, May 1995, pp. 487-494.

Caspi, E., et al., "Stream Computations Organized for Reconfigurable Execution (SCORE): Introduction and Tutorial," Aug. 25, 2000, pp. 1-31, Version 1.0.

Compton, K., et al., "An Introduction to Reconfigurable Computing," IEEE Computer, Apr. 2000, 9 pages.

Compton, K., et al., "Reconfigurable Computing: A Survey of Systems and Software," ACM Computing Surveys, Jun. 2002, pp. 171-210, vol. 34, No. 2, ACM, New York, NY.

Dehon, A., "Balancing Interconnect and Computation in a Reconfigurable Computing Array (or, why don't you really want 100% LUT utilization)," Proceedings of the International Symposium on Field Programmable Gate Arrays, Feb. 1999, pp. 125-134.

(56) References Cited

OTHER PUBLICATIONS

Dehon, A., "DPGA Utilization and Application," Proceedings of the 1996 ACM Fourth International Symposium on Field-Programmable Gate Arrays FPGA, Feb. 11-13, 1996, 7 pages, Monterey, California, USA.
Dehon, A., "Dynamically Programmable Gate Arrays: A Step Toward Increased Computational Density," Proceedings of the Fourth Canadian Workshop on Field-Programmable Devices, May 1996, pp. 47-54.
Dehon, A., "Reconfigurable Architectures for General-Purpose Computing," A.I. Technical Report No. 1586, Oct. 1996, pp. i-353.
Dehon, A., "The Density Advantage of Configurable Computing," IEEE, Apr. 2000, pp. 41-49.
Dehon, A., "Transit Note #121: Notes on Programmable Interconnect," M.I.T. Transit Project, Feb. 1995, pp. 1-13.
Dehon, A., et al., "Design Patterns for Reconfigurable Computing," Proceedings of the IEEE Symposium on Field-Programmable Custom Computing Machines, Apr. 2004, 11 pages.
Dehon, A., et al., "DPGA-Coupled Microprocessors: Commodity ICs for the Early $21^{st}$ Century," FCCM '94-IEEE Workshop on FPGAs for Custom Computing Machines, Apr. 1994, 9 pages, Napa Valley, California, USA.
Dehon, A., et al., "Reconfigurable Computing: What, Why, and Implications for Design Automation," DAC 1999, Jun. 1999, 6 pages, ACM, New Orleans, Louisiana.
Enzler, R., et al., "Virtualizing Hardware with Multi-Context Reconfigurable Arrays," Lecture Notes in Computer Science, Sep. 2003, pp. 151-160.
Giraud-Carrier, C., "A Reconfigurable Data Flow Machine for Implementing Functional Programming Languages", SIGPLAN Notices, Sep. 1994, vol. 29 No. 9, pp. 22-28.
Goldstein, S.C., et al., "PipeRench: A Reconfigurable Architecture and Compiler," IEEE, Apr. 2000, pp. 70-77.
Hauck, S., et al., "Totem: Domain-Specific Reconfigurable Logic," IEEE Transactions on VLSI Systems, 2006 Month N/A, pp. 1-25.
Hauser, J., et al., "Garp: A MIPS Processor with a Reconfigurable Coprocessor", FPGAs for Custom Computing Machines, 1997. Proceedings., The 5th Annual IEEE Symposium on FPGA-Based Custom Computing Machines, Apr. 16-18, 1997, pp. 12-21.
Keutzer, K., "Overview of *configurable* architectures," Feb. 28, 2002, slides 1-29.
Lehn, D.I., et al., "Evaluation of Rapid Context Switching on a CSRC Device," Proceedings of the International Conference on Engineering of Reconfigurable Systems and Algorithms, Jun. 24-27, 2002, 7 pages.
Lertora, F., et al., "Handling Different Computational Granularity by a Reconfigurable IC Featuring Embedded FPGAs and a Network-On-Chip," 13th Annual IEEE Symposium on Field-Programmable Custom Computing Machines (FCCM 2005) 2005, Apr. 18-20, 2005.
Luk, W., et al., "Compilation Tools for Run-Time Reconfigurable Designs," FPGAs for Custom Computing Machines, 1997. Proceedings., The 5th Annual IEEE Symposium on FPGA-Based Custom Computing Machines, Apr. 16-18, 1997, pp. 56-65.
Markovskiy, Y., et al., "Analysis of Quasi-Static Scheduling Techniques in a Virtualized Reconfigurable Machine," FPGA '02, Feb. 24-26, 2002, 10 pages, ACM, Monterey, California, USA.
Master, P., "The Next Big Leap in Reconfigurable Systems," A Technology Vision Whitepaper, Apr. 28, 2004 but © 2003, pp. 1-8, QuickSilver Technology, Inc., San Jose, California.
Mirsky, E., et al., "MATRIX: A Reconfigurable Computing Architecture with Configurable Instruction Distribution and Deployable Resources," Proceedings of the IEEE Workshop on FPGAs for Custom Computing Machines, Apr. 1996, 10 pages.
Mirsky, E., et al., "MATRIX: A Reconfigurable Computing Device with Configurable Instruction Distribution and Deployable Resources (Extended Abstract)," Hot Chips Symposium 1997, Aug. 1997, pp. 1-3.
Nelson, B.E., "Reconfigurable Computing: An Introduction and Overview," Sep. 23, 1998, pp. 1-43.
Niedzielski, D., "An Overview of Reconfigurable Computing," NPL Date Unknown, 26 slides.
Perissakis, S., et al., "Embedded DRAM for a Reconfigurable Array," Proceedings of the 1999 Symposium on VLSI Circuits, Jun. 1999, slides 1-24.
Perissakis, S., et al., "Embedded DRAM for a Reconfigurable Array," Proceedings of the 1999 Symposium on VLSI Circuits, Jun. 1999, 4 pages.
Plunkett, B., et al., "Adapt2400 ACM Architecture Overview," A Technology Whitepaper, 2004 Month N/A, pp. 1-9, QuickSilver Technology, Inc.
Quicksilver Technology, Inc., "Adapt2000 ACM System Platform," Apr. 2004, pp. 1-39, QuickSilver Technology, Inc., San Jose, California, USA.
Scalera, S., et al., "The Design and Implementation of a Context Switching FPGA", FPGAs for Custom Computing Machines, 1998. Proceedings. IEEE Symposium on FPGAs for Custom Computing Machines, Apr. 15-17, 1998, pp. 78-85.
Schaumont, P., et al., "A Quick Safari Through the Reconfiguration Jungle," $38^{th}$ Design Automation Conference, Jun. 2001, pp. 172-177, Las Vegas, Nevada, USA.
Schmit, H., "Incremental Reconfiguration for Pipelined Applications," Proceedings of the $5^{th}$ IEEE Symposium on FPGA-Based Custom Computing Machines, Apr. 16-18, 1997, 9 pages.
Schmit, H., et al., "Queue Machines: Hardware Compilation in Hardware," Proceedings of the 10th Annual IEEE Symposium on Field-Programmable Custom Computing Machines, Apr. 22-24, 2002, 9 pages.
Slade, A.L., et al., "Reconfigurable Computing Application Frameworks," $11^{th}$ Annual IEEE Symposium on Field-Programmable Custom Computer Machines, Apr. 9-11, 2003, 10 pages.
Snider, G., "Performance-Constrained Pipelining of Software Loops onto Reconfigurable Hardware," FPGA '02, Feb. 24-26, 2002, pp. 177-186, ACM, Monterey, California, USA.
Soviani, C., et al., "Optimizing Sequential Cycles through Shannon Decomposition and Retiming", Design, Automation, and Test in Europe, Mar. 10, 2006, pp. 1085-1090.
Tau, E., et al., "A First Generation DPGA Implementation," Proceedings of the Third Canadian Workshop on Field-Programmable Devices, May 1995, pp. 138-143.
Tau, E., et al., "Transit Note #114: A First Generation DPGA Implementation," M.I.T. Transit Project, Jan. 1995, pp. 1-8.
Tsu, W., et al., "HSRA: High-Speed, Hierarchical Synchronous Reconfigurable Array," Proceedings of the International Symposium on Field Programmable Gate Arrays, Feb. 1999, pp. 69-78.
Vuillemin, J., et al., "Programmable Active Memories: Reconfigurable Systems Come of Age," Very Large Scale Integration (VLSI) Systems, IEEE Transactions on vol. 4, Issue 1, Mar. 1996, pp. 56-69.
Xilinx, Inc., "Virtex-II Pro System Wake-Up Solutions", Virtex-II Pro System Wake-up Solutions, Aug. 13, 2007, pp. 11-22, v1.1, Xilinx, Inc.

* cited by examiner

DELAYING START OF USER DESIGN EXECUTION

CLAIM OF BENEFIT TO PRIOR APPLICATIONS

This present Application claims the benefit of U.S. Provisional Patent Application 61/576,972, filed Dec. 16, 2011. The present Application also claims the benefit of U.S. Provisional Patent Application 61/620,413, filed Apr. 4, 2012. The present Application also claims the benefit of U.S. Provisional Patent Application 61/649,877 filed on May 21, 2012. The present Application also claims the benefit of U.S. Provisional Patent Application 61/718,584 filed on Oct. 25, 2012.

BACKGROUND

For a modern electronic system to function properly, the system must start normal operations from a known, predictable state. Unfortunately, most state elements in electronic systems consist of volatile storage circuits and do not automatically power up to known, predictable states. In order for electronic systems with volatile storage circuits to function predictably or at all, designs of electronic system must perform initialization operations upon power up such that the electronic system can start or resume normal operations at known, predictable states.

In some electronic systems, such initialization involves application of a reset signal that drives state elements in the electronic system to an initialized state. However, in order for the system to then function correctly, the various state elements of the electronic system must leave the initialized state and enter normal operations in a predictable, coordinated manner. For electronic systems based on integrated circuits (ICs), this usually involves making sure that the reset signals to the state elements are synchronously lifted across ICs. For some ICs, this is can be satisfactorily addressed by adding buffer elements and pipeline elements on a global reset signal.

However, for an IC that includes a large number of state elements, making sure that the reset signals are synchronously lifted would require a large number of resources on the IC. This problem is particularly acute for ICs that include configurable circuits for implementing user designs, because routing these reset signals would require the consumption of large number configurable user resources such as look-up tables and routing multiplexers.

What is needed is a method or circuitry for use in an IC with configurable circuits that controls the start of user design operations upon initialization. Such a method or circuitry would allow the IC to start user design operations correctly without requiring the consumption of large number configurable user resources.

SUMMARY

For an integrated circuit (IC) that is designed to execute user defined operations after initialization, some embodiments of the invention provide circuitry in the IC that delays the start of the user design execution until a set of initial condition has been computed and propagated. In some embodiments, a sequencing circuit holds a first group of circuits at an initial state while a second group of circuits computes and propagates a set of initial conditions based at least partly on the initial state of the first group of circuits. The circuits in the first group when being held disregard their inputs and do not change their outputs. The first group of circuits is released from its initial state after the second group of circuits has completed computation and propagation of the set of initial conditions. The circuits in the first group when released are freed to store or clock-in new inputs and produce new outputs in order to perform the user defined operations in conjunction with the second group of circuits.

In some embodiments, the first group of circuits includes a set of storage circuits that can be initialized to the initial state by a "init" or reset signals. The second group of circuits includes a set of logic circuits that computes and propagates the set of initial conditions based at least partly on the initial state of the first group of circuits. When performing the user defined operations, the storage circuits in the first group of circuits continuously clocks in inputs that are at least based partly on the outputs of the second group of circuits, while the logic circuits in the second group of circuits continuously computes new outputs based at least partly on the signals provided by the storage circuits in the first group of circuits. In some embodiments, the second group circuits also include a set of storage circuits or state elements that take multiple clock cycles or multiple states to compute and propagate the set of initial conditions.

Some embodiments release the first group of circuits when and/or after the second group of circuits reaches a final computed/propagated state. The first group of circuits starts its user defined operations by clocking in a set of new inputs that is at least partly based on the final computed/propagated state reached by the second group of circuits. In some embodiments, the IC uses a delay start signal to controls start of the user design operations by holding the first group of circuits at the initial state until the second group of circuits has reached the final computed/propagated state.

In some embodiments, the first and second groups of circuits include configurable circuits that implement a user design based on configuration data, and the IC delays the start of the operations of the user design until the set of initial conditions has been computed and propagated. In some embodiments, the configurable circuits are reconfigurable circuits that reconfigure every clock cycle based on different sets of configuration data. In some of these embodiments, the reconfigurable circuits in the second set of circuits reconfigure every clock cycle to compute and propagate the set of initial conditions based at least partly on the initial state of the first group of circuits before the delayed start of user design.

In some embodiments, the reconfigurable circuits are loopered such that the different sets of configuration data are sequentially repeated in different iterations of reconfiguration. In some embodiments, each iterations of reconfiguration in the second group of circuits produces the final computed/propagated state at the end of the iteration as long as the first group of circuit is held at the initial state. In some embodiments, the IC waits for a system ready indication before allowing the delayed start of user design. While waiting for the system ready indication, the first group of circuits may be held in their initial state for several iterations of reconfiguration.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawings, but rather are to be defined by the appended claims, because the claimed subject matters can be embodied in other specific forms without departing from the spirit of the subject matters.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

Figure 1A:
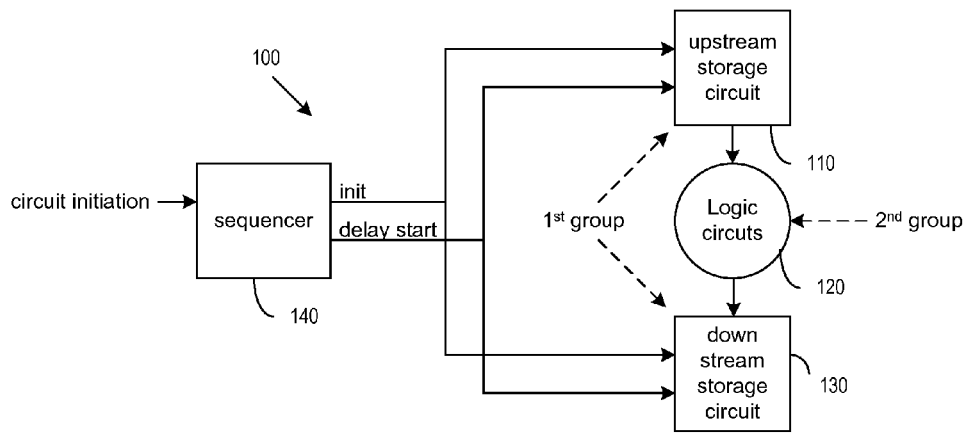
FIGS. 1a and 1b illustrates the delayed start of user design execution in an IC.

In the following description, numerous details are set forth for the purpose of explanation. However, one of ordinary skill in the art will realize that the invention may be practiced without the use of these specific details. In other instances, well-known structures and devices are shown in block diagram form in order not to obscure the description of the invention with unnecessary detail.

For an integrated circuit (IC) that is designed to execute user defined (or designed) operations after initialization, some embodiments of the invention provide circuitry in the IC that delays the start of the user design execution until a set of initial condition has been computed and propagated. In some embodiments, a sequencing circuit holds a first group of circuits at an initial state while a second group of circuits computes and propagates a set of initial conditions based at least partly on the initial state of the first group of circuits. The circuits in the first group when being held disregard their inputs and do not change their outputs. The first group of circuits is released from its initial state after the second group of circuits has completed computation and propagation of the set of initial conditions. The circuits in the first group when released are freed to store or clock-in new inputs and produce new outputs in order to perform the user defined operations in conjunction with the second group of circuits.

In some embodiments, the first group of circuits includes a set of storage circuits that can be initialized to the initial state by a "init" or reset signals. The second group of circuits includes a set of logic circuits that computes and propagates the set of initial conditions based at least partly on the initial state of the first group of circuits. When performing the user defined operations, the storage circuits in the first group of circuits continuously clocks in inputs that are at least based partly on the outputs of the second group of circuits, while the logic circuits in the second group of circuits continuously computes new outputs based at least partly on the signals provided by the storage circuits in the first group of circuits. In some embodiments, the second group circuits also include a set of storage circuits or state elements that take multiple clock cycles or multiple states to compute and propagate the set of initial conditions.

Some embodiments release the first group of circuits when the second group of circuits reaches a final computed/propagated state. The first group of circuits starts its user defined operations by clocking in a set of new inputs that is at least partly based on the final computed/propagated stated reached by the second group of circuits. In some embodiments, the IC uses a delay start signal to controls start of the user design operations by holding the first group of circuits at the initial state until the second group of circuits has reached the final computed/propagated state.

In some embodiments, the first and second groups of circuits include configurable circuits that implement a user design based on configuration data, and the IC delays the start of the operations of the user design until the set of initial conditions has been computed and propagated. In some embodiments, the configurable circuits are reconfigurable circuits that reconfigure every clock cycle based on different sets of configuration data. In some of these embodiments, the reconfigurable circuits in the second set of circuits reconfigure every clock cycle to compute and propagate the set of initial conditions based at least partly on the initial state of the first group of circuits before the delayed start of user design.

In some embodiments, the reconfigurable circuits are loopered such that the different sets of configuration data are sequentially repeated in different iterations of reconfiguration. In some embodiments, each iterations of reconfiguration in the second group of circuits produces the final computed/propagated state at the end of the iteration as long as the first group of circuit is held at the initial state. In some embodiments, the IC waits for a system ready indication before allowing the delayed start of user design. While waiting for the system ready indication, the first group of circuits may be held in their initial state for several iterations of reconfiguration.

Section I below describes the delayed start of user design execution. Section II describes the computation or propagation of initial conditions in reconfigurable circuits. Section III describes various methods of coordinating delayed start of user design execution across an IC. Section IV describes configurable IC architecture, and Section V describes reconfigurable architecture. Section VI describes configurable IC and systems.

I. Delaying Start of User Design Execution

For an IC that implements a user design and performs operations according to the user design, proper execution of the user design requires some circuits in the IC to be initialized properly to a known state prior to the start of the user design execution. In some embodiments, the IC delays the start of the user design execution (i.e., normal operations) until a set of initial condition has been computed and propagated. In some embodiments, a sequencing circuitry initializes a first group of circuits to an initial state and holds the first group of circuits at the initial state while a second group of circuits computes and propagates a set of initial conditions based at least partly on the initial state of the first group of circuits.

Figure 1B:
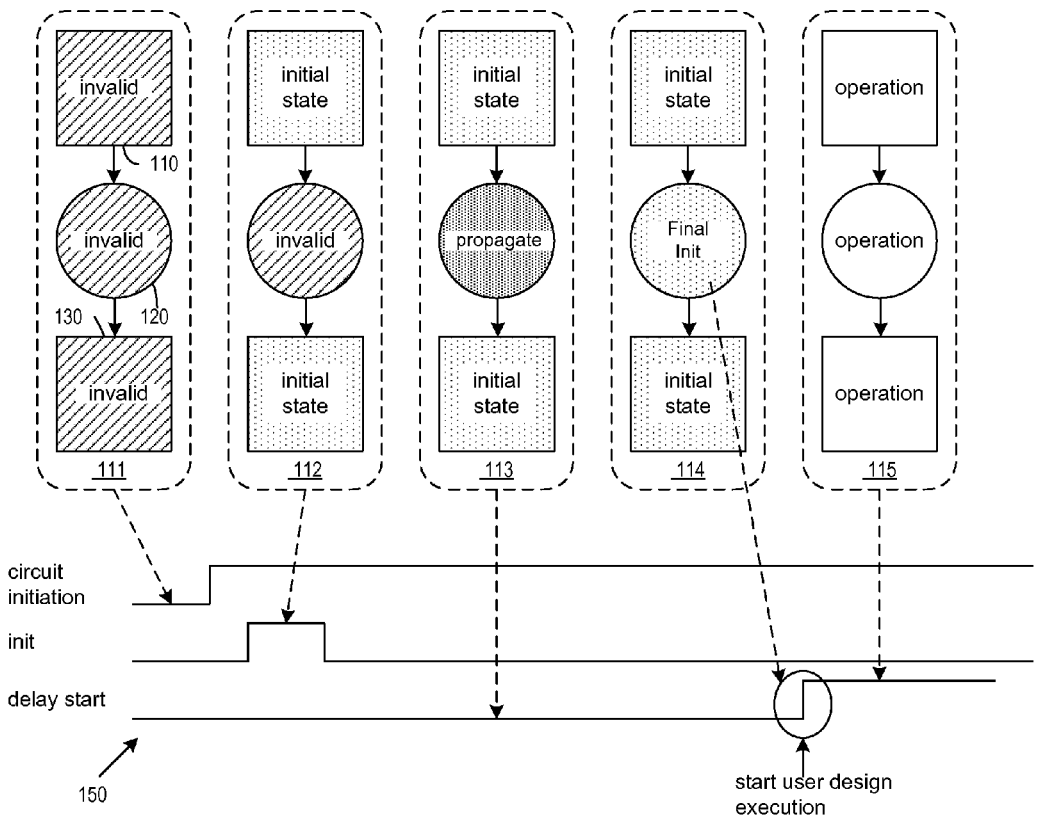

FIGS. 1a and 1b illustrates the delayed start of user design execution in an IC. The figures illustrate a user design 100 (or the circuits implementing the user design 100) in an IC in which a first group of circuits is being held at an initial state while a second group of circuits propagates and computes a set of initial conditions. FIG. 1a illustrates a block diagram of the user design 100 the first and second groups of circuits. FIG. 1b conceptually illustrates the first and second groups of circuits in different stages 111-115 of an operation to start user design execution. FIG. 1b also includes a timing diagram 150 of the control signals involved in the control of the first and second groups of circuits during the operation to start user design execution.

As illustrated in FIG. 1a, the user design 100 includes an upstream storage circuit 110, a logic circuit 120, a downstream storage circuit 130, and a sequencer 140. The output of the upstream storage circuit 110 feeds the input of the logic circuit 120, while the output of the logic circuits feeds the input of the downstream storage circuits 130. In some embodiments, the upstream storage circuit 110 receives inputs from other circuits of the IC (not illustrated) such as other logic circuits, storage circuits, memories, or I/O circuits.

The upstream storage circuits 110 and downstream storage circuits 120 include one or more storage elements for storing data of the user design and/or for maintaining the states of the user design. These storage elements can include flip-flops, registers, latches, memories or other types of storage elements or state elements. In some embodiments, these storage elements are embedded in larger circuit blocks such as digital signal processors (DSP), first-in-first-out data buffers (FIFOs), clock domain controls, memory modules, counters, address pointers, and various state machines. When initialized, at least some of these storage circuits initialize to initial states that are defined by the user as part of the user design. In some embodiments, these user defined initial state are loaded into the IC as part of the configuration data that defines the user design and not hardwired into the IC.

The logic circuits 120 perform arithmetic or logical computation based at least partly on the input it receives from the upstream storage circuit 110. The logic circuits 120 can include combinational logic circuits, look up tables (LUTs), arithmetic logic units (ALUs), DSPs, FIFOs, clock domain controls, memory modules, counters, address pointers, various state machines, and/or other blocks of circuits that performs logical computations. Some of these larger logical computation blocks include storage elements. Some of these larger computation blocks are sequential circuits that keep track of their states in storage elements. These storage elements can also include flip-flops, registers, latches, memories, or other elements capable of storing state information or intermediate computation results.

The sequencer 140 receives a circuit initiation signal and in turn provides an init signal and a delay start signal to the upstream storage circuit 110 and the downstream storage circuit 130. The init signal, when asserted, initializes (or resets) the upstream storage circuit 110 and the downstream storage circuit 130 to a known initial state. The delay start signal, when de-asserted, holds the upstream storage circuit 110 and the downstream storage circuit 130 at the known initial state while the logic circuit 120 propagates and computes a set of initial conditions. The storage circuits (upstream storage circuit 110 and downstream storage circuit 130) are part of the first group of circuits that are being initialized and held at the known initialized state. The logic circuit 120 is part of the second group of circuits that compute and propagate the set of initial conditions.

FIG. 1b illustrates the delayed start of user design execution in five stages 111-115, each of the stages correspond to particular point in time in the timing diagram 150. Each of the stages includes graphical representations of the upstream storage circuit 110, the logic circuit 120, and the downstream storage circuit 130. The graphical representation of the storage circuits 110 and 130 includes indications of the status of the data being stored in those storage circuits, while the graphical representation of the logic circuits 120 includes the indications of the status of the data being computed, propagated, or outputted by the logic circuits 120.

The timing diagram 150 includes waveform for the circuit initiation signal, the init signal, and the delay start signal. The circuit initiation signal, when received by (i.e., asserted to) the sequencer 140, starts a process for performing initial condition computation. The "init" signal, when asserted by the sequencer 140, resets the storage circuits 110 and 130 (i.e., the first group of circuits) into a known, initial state. The "delay start" signal, when deasserted, prevents the storage circuits 110 and 130 from clocking in new value (except when the init signal is asserted to reset the storage circuits to their initial states). The assertion of "delay start" signal by the sequencer 140 allows the storage circuits 110 and 130 to clock in new data and starts the user design.

At the first stage 111, the sequencer 140 has yet to receive the circuit initiation signal and has yet to assert the init signal. The data being stored by the first group of circuits (storage circuits 110 and 130) and the data being produced by the second group of circuits (the logic circuits 120) are both invalid (i.e., cannot be used for starting user defined operations) because these circuits have not been initialized.

At the second stage 112, the sequencer 140 has received the circuit initiation signal and in turn asserted the init signal. The assertion of the init signal and causes the storage circuits 110 and 130 to reset to their initial states. The delay start signal is de-asserted, which causes the storage circuits 110 and 130 to be held at their initial states as long as the delay start signal remains de-asserted. The logic circuits 120 at this stage has yet to compute or propagate the initial state held at the storage circuits 110, and hence data in the logic circuit 120 is still invalid.

At the third stage 113, the storage circuits 110 and 130 continue to be held at their initial states by the de-assertion of the delay start signal, which prevents the storage circuits 110 from outputting new data to the logic circuits 120 and the storage circuit 130 from clocking in new data from the logic circuits 120. The logic circuits 120, on the other hand, is computing or propagating a set of initial conditions based on the initial state being held at the storage circuit 110.

At the fourth stage 114, the logic circuits 120 have completed the computation of initial conditions and reached a final initial condition. This final initial condition is the final result of the propagation of the initial state being held at the storage circuit 110. The sequencer 140 in some embodiments in turn asserts the delay start signal and allows the storage circuits in the first group of circuits (i.e., the upstream storage circuit 110 and the downstream storage circuit 130) to accept input and clock in new data. This allows the downstream storage circuit 130 to clock in a set of inputs based on the final initial condition of the logic circuits 120. By clocking in the final initial condition, the downstream storage circuit 130 will enter valid operation at the next clock cycle.

At the fifth and final stage 115, the upstream storage circuit 110, the logic circuit 120, and the downstream storage circuit 130 are all free to clock in new data. Since the downstream storage circuit was held until the logic circuit 120 (i.e., the final initial condition) was able to produce a valid operational data, the downstream storage circuit 130 is now performing user defined operations based on valid, known initialized states.

Figure 2:
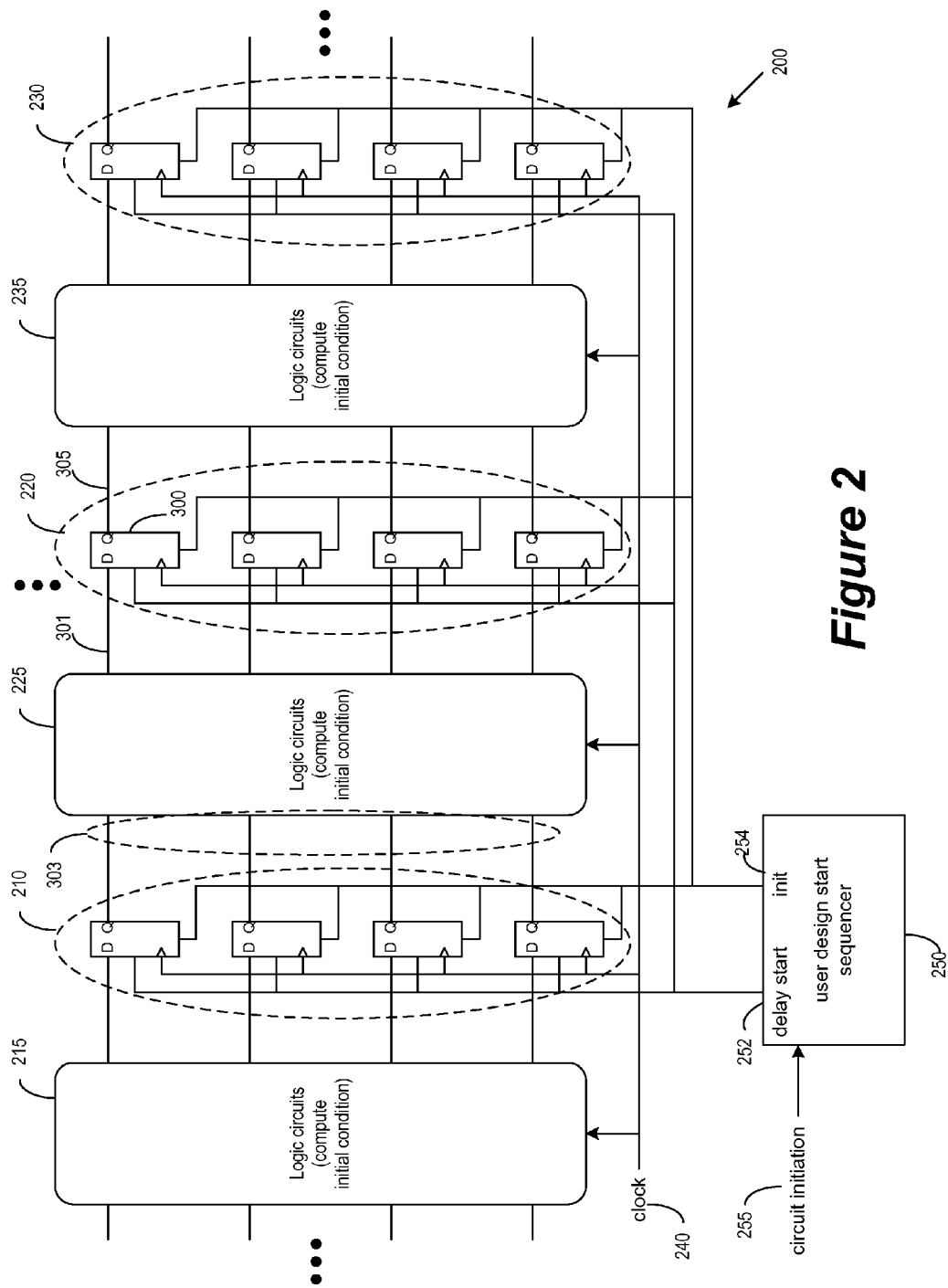
FIG. 2 illustrates an example IC that includes logic circuits that propagate and computes initial conditions based on initial states at storage circuits.

FIG. 2 illustrates an example IC 200 that includes logic circuits that propagate and computes initial conditions based on initial states at storage circuits. The IC 200 includes storage circuits 210, 220, and 230 and logic circuits 215, 225, and 235. These storage circuits and logic circuits implement a user design that cannot function correctly unless the storage circuits and the logic circuits (i.e., the first and second groups of circuits) are initialized properly. The IC 200 also includes a user design start sequencer 250 that generates control signals for resetting and holding the storage circuits 210, 220, and 230. These signals includes an init signal 254 for resetting the storage circuits to a known initial state, and a delay start signal 252 for holding the storage circuits at the known initial state until the completion of the initial condition computation by the logic circuits 215, 225 and 235.

The storage circuits 210, 220, and 230 (i.e., the first group of circuits) includes storage circuits that operate on clock 240 and receives input signals from the set of logic circuits 215, 225, and 235, respectively. The outputs of storage circuits 210 serve as input to the logic circuits 225, and the outputs of the storage circuits 220 serve as the input to the logic circuits 235. For example, the storage circuit 220 includes a storage circuit 300. The output of the storage circuit 300 (Q terminal 305) feeds one of the inputs to the logic circuits 235. The input of the storage circuit 300 (D terminal 301) receives an output from the logic circuits 225, whose inputs 303 includes outputs (Q terminals) of the storage circuits 210.

The storage circuits 210, 220, and 230 receive the init signal 254 and the delay start signal 252 from the user design start sequencer circuit 250. The init signal 254 forces the storage circuits 210, 220, and 230 to go into known initial states when asserted. In some embodiments, the storage circuits 210, 220, and 230 includes flip flops or registers that can be asynchronously or synchronously reset to a predetermined initial state upon the receipt of the init signal. The delay start signal 252, when de-asserted, causes the storage circuits 210, 220, and 230 to be held at a same state and not accept inputs from the logic circuits 215, 225, and 235. If the delay start 252 is de-asserted when the init signal 254 is asserted, the storage circuits 210, 220, and 230 would be held at their initial states until the assertion of the delay start signal.

The logic circuits 215, 225, and 235 compute and produce their outputs based on the inputs they receive. As illustrated in FIG. 2, the logic circuits 225 receive inputs from storage circuits 210, and the logic circuits 235 receive inputs from the storage circuits 220. Although not illustrated, the logic circuits 215 receive inputs from other storage circuits in the IC 200, which may include storage circuits 210, 220 or 230. In some embodiments, the logic circuits 210, 220, and 230 also receive the clock 240 for operating storage or state elements within.

During the initial condition computation, the storage circuits 210, 220, and 230 are initialized and held at their initial states. These initial states being held serve as inputs to the logic circuits 215, 225, and 235 during the assertion of the delay start signal 252. The logic circuits 215, 225, and 235 in turn compute and propagate a set of outputs based these inputs. These computed outputs, based on the initial states of their respective upstream storage circuits, would eventually reach the final initial condition when the logic circuits complete their initial condition computation. The final initial condition reached by the logic circuits 215, 225, and 235 will be clocked in by their respective downstream storage circuits at the start of user design execution when the delay start signal is asserted. For example, the storage circuits 220 are downstream storage circuits to the logic circuits 225, and the storage circuits 210 are upstream storage circuits to the logic circuits 225. The logic circuits 225 compute a set of outputs based on the initial states of the upstream storage circuits 210. The computed outputs eventually reach the final initial condition, which will be clocked in by the storage circuits 220 at the start of user design execution when the delay start signal is asserted.

Prior to the completion of the initial condition computation by the logic circuits 215, 225, and 235, the inputs of the storage circuits 210, 220, and 230 can be invalid. The inputs are invalid because their respective upstream storage circuits have yet to be reset to their initial state. The inputs to the storage circuits 210, 220, and 230 become valid for clock-in only when the upstream storage circuits feeding the logic circuits 215, 225, and 235 have been reset to their initial states and the logic circuits 215, 225, and 235 complete propagation and computation of the initial conditions based on these upstream initial states. Thus, for example, the D input to the storage circuit 300 becomes valid for clock-in when the storage circuits 210 have been reset to their initial state and the logic circuits in the set 225 complete computation and propagation of initial conditions (i.e., reach the final initial condition) based on the initial state of the storage circuits 210.

In some embodiments, the logic circuits 215, 225, and 235 includes only purely combinatorial circuits without any storage circuits. In these embodiments, the logic circuits compute and propagate the initial condition asynchronously from the input to the output. In some embodiments, the logic circuits 215, 225, and 235 include one or more free-running storage circuits. These free-running storage circuits are not controlled by any control signals and are free to synchronously pass through signals every clock cycle. When the logic circuits 215, 225, and 235 are implemented as purely combinatorial circuits and/or use only storage circuits that are free-running, the outputs of the logic circuits will settle on a computed value as long as their inputs are held at a constant value. In the case of initial condition computation, the outputs of the logic circuits 215, 225, and 235 will settle on the final initial condition as long as their respective inputs are held at a known initial state value (e.g., the initial states of the storage circuits 210, 220, and 230). In these instances, user design execution can start (i.e., asserting the delay start signal 252) as long as the logic circuits 215, 225, and 235 have reached their final initial condition.

In some embodiments, at least some of the storage elements included in the logic circuits 215, 225, and 235 are not free running. They are instead state elements that implements one or more state machines in the logic circuits. To complete a computation (such as propagating initial condition), the state machines of the logic circuits go through several states and/or clock cycles of computation until a final state is reached to produce a final output (such as the final initial condition). In some embodiments, the state elements in the logic circuits are initialized (not illustrated) by a reset signal such as the init signal 254 or by a synchronous counter enable signal that, when de-asserted, holds the state machines to an initial state. In some of these embodiments, the state machine is allowed to proceed through its state only when the counter enable signal is asserted.

In some embodiments, the logic circuits in 215, 225, and 235 are configurable circuits and the storage circuits in 210, 220, and 230 are user storage circuits. A configurable circuit receives configuration data that specifies the operation that the configurable circuit has to perform from a set of operations that the configurable circuit can perform. A user storage circuit is a storage circuit that receives and stores user signals. Unlike configuration data which is generated and supplied to the IC prior to the IC's real time operations, user signals are generated based on inputs received by the IC during the IC's real time operations. In some embodiments, the initial states of user storage circuits are specified by the user as part of the user design. Initial states that are specified as part of the user design are specified by configuration data and therefore not hardwired into IC. Configurable circuits will be discussed further below in Section IV.

In some embodiments, the logic circuits 215, 225, and 235 includes reconfigurable circuits. Reconfigurable circuits reconfigure every clock cycle to implement different operations or logic functions based on different sets of configuration data. In some embodiments, a reconfigurable circuit periodically "loops" through a set of reconfiguration states or stages. Different reconfiguration states or stages are based on different sets of configuration data stored in configuration data storage. When the logic circuits 215, 225, and 235 are implemented using reconfigurable circuits, their outputs would continue to looper through the different reconfiguration states even when their inputs are held constant at an initial value (i.e., the initial states at the storage circuits 210, 220, and 230.) Reconfigurable circuits will be discussed further below in Section V.

When the storage circuits 210, 220 or 230 are held in their respective initial states, the reconfigurable circuits receive the initial states as input and compute the initial conditions by going through several reconfiguration stages or states. Each reconfigurable circuit reconfigures itself at each of the stages to perform a part of the computation. In some embodiments, the initial conditions feeding the storage circuits 210, 220, and 230 become valid (i.e., reaching the final initial condition) only when the reconfigurable circuits have reached a final reconfiguration stage. Some embodiments therefore synchronize the timing of the start of user design execution (i.e., the assertion of the delay start signal) with the loopering of reconfiguration states such that the delay start signal 252 is asserted only at the correct reconfiguration state (i.e., when final initial condition is reached). The computation of initial condition and the timing of the delay start signal based on reconfiguration states will be further discussed below in Section II.

The user design start sequencer 250 controls the init signal 254 and the delay start signal 252 for the storage circuits 210, 220, and 230. The user design start sequencer 250 controls these signals based on a circuit initiation signal 255. The circuit initiation signal 255, when asserted, causes the user design start sequencer 250 to start a process that toggles the init signal 254 and the delay start signal 252. An example of a process performed by the user design start sequencer 250 is described below by reference to FIG. 4.

In some embodiments, the user design start sequencer 250 controls the timing of the delay start signal 252 with respect to the init signal 254 such that the storage circuits 210, 220, and 230 will be reset to the initial state by the init signal and held at the initial state by the delay start signal. The user design start sequencer 250 controls the timing of the delay start signal 252 such that the storage circuits 210, 220, and 230 will be free to receive input signals only when logic circuits 215, 225, and 235 have completed computation of initial conditions and present the valid input (i.e., final initial condition) at the input terminals of the storage circuits 210, 220, and 230. In some embodiments, the user design start sequencer 250 asserts the delay start signal 252 at a specific time after the assertion of the init signal 254 in order to ensure that the logic circuits have reached their final initial conditions when the delay start signal 252 is asserted to start user design execution. For some embodiments whose logic circuits includes reconfigurable circuits, the user design start sequencer 250 controls the timing of the assertion of delay start 252 to correspond with a particular reconfiguration state at which the final initial condition is available for clock-in by the storage circuits 210, 220, and 230.

Figure 3:
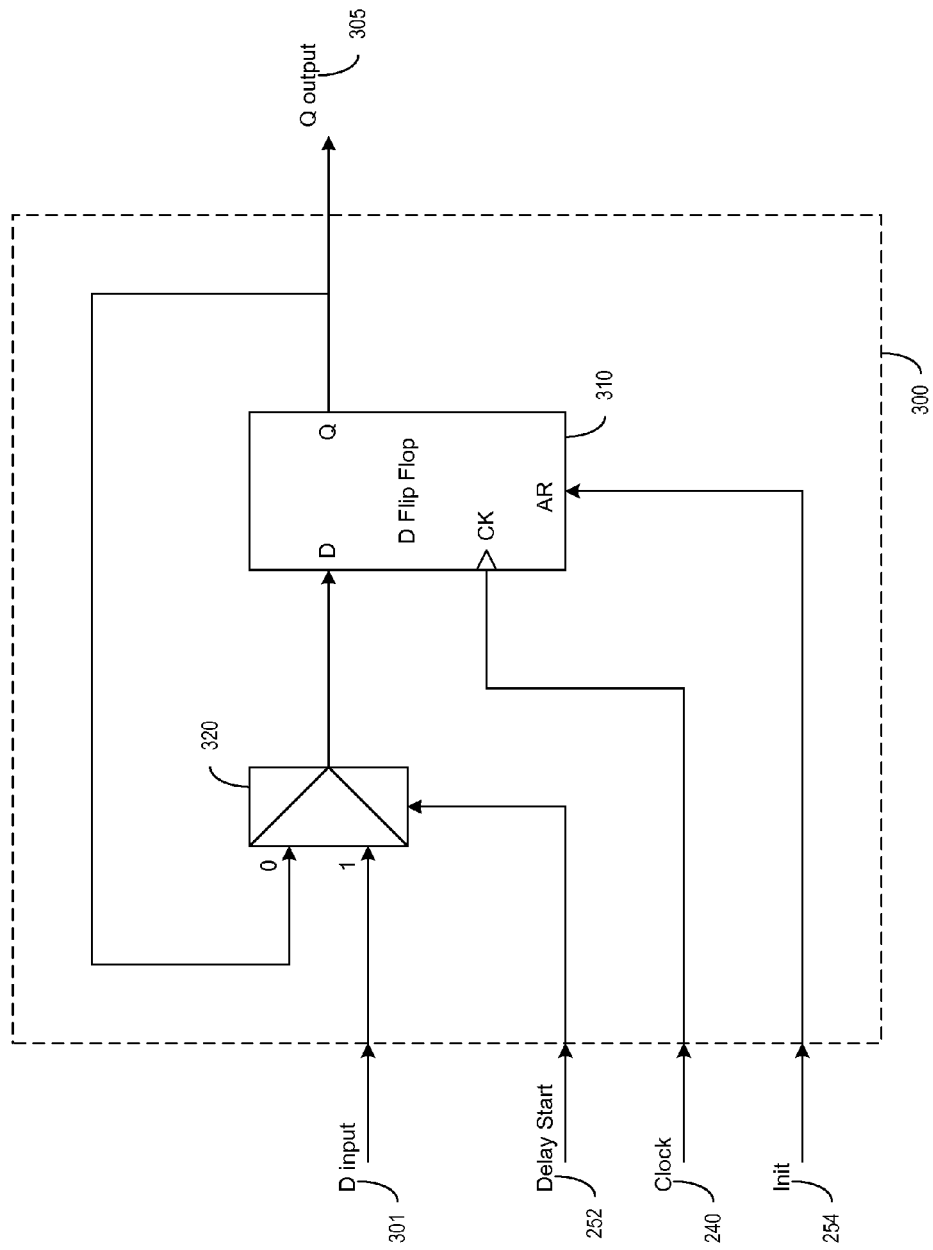
FIG. 3 illustrates an example implementation of a storage circuit that is controlled by an init signal and a delay start signal for some embodiments.

FIG. 3 illustrates an example implementation of a storage circuit that is controlled by an init signal and a delay start signal for some embodiments. The figure illustrates the storage circuit 310, which is one of the storage circuits in the IC 200 that receive the delay start signal 252 and the init signal 254. The storage circuit 300 includes a D-flip-flop 310 and a multiplexer 320. The storage circuit 300 produces a Q output 305 and receives a D input 301, the delay start signal 252, the clock signal 240, and the init signal 254.

The D-flip-flop 310 has a CK (clock) terminal that receives the clock signal of the storage circuit. The D-flip-flop also has a D input terminal and a Q output terminal. The rising edge of the clock signal at the CK terminal causes the D-flip-flop 310 to clock in signal from its D terminal to its Q terminal. The D-flip-flop 310 also receives the init signal at its "AR" terminal, which causes the D-flip-flop 310 to asynchronously reset to an initial state.

The output of the multiplexer 320 feeds the D terminal of the D-flip-flop 310. The output is determined by the select terminal of the multiplexer 320, which selects either from the '0' terminal or the '1' terminal of the multiplexer 320. The select terminal of the multiplexer is based on the polarity of the delay start signal 252. The '0' terminal of the multiplexer 320 comes from the Q terminal of the D-flip-flop 310, such that when the delay start is '0', the D-flip-flop 310 will hold its value by the feedback from its Q terminal to its D terminal. Only when the delay start becomes '1' will the D input of the storage circuit 300 be able to reach the D terminal of the D-flip-flop 310. In other words, if the D flip-flop is reset to its initial state by the assertion of the init signal 254 while the delay start signal 252 is de-asserted at '0', the D flip-flop 310 (and hence the storage circuit 300) will hold on to the initial state until the delay start signal is asserted to '1'.

One of ordinary skill in the art would realize that the purpose of the multiplexer 320 is for holding the value of the D-flip-flop constant when the delay start signal 252 is de-asserted. There are other alternative implementations of the storage circuit 300 that can hold its stored value constant based on a control signal such as the delay start signal.

Figure 4:
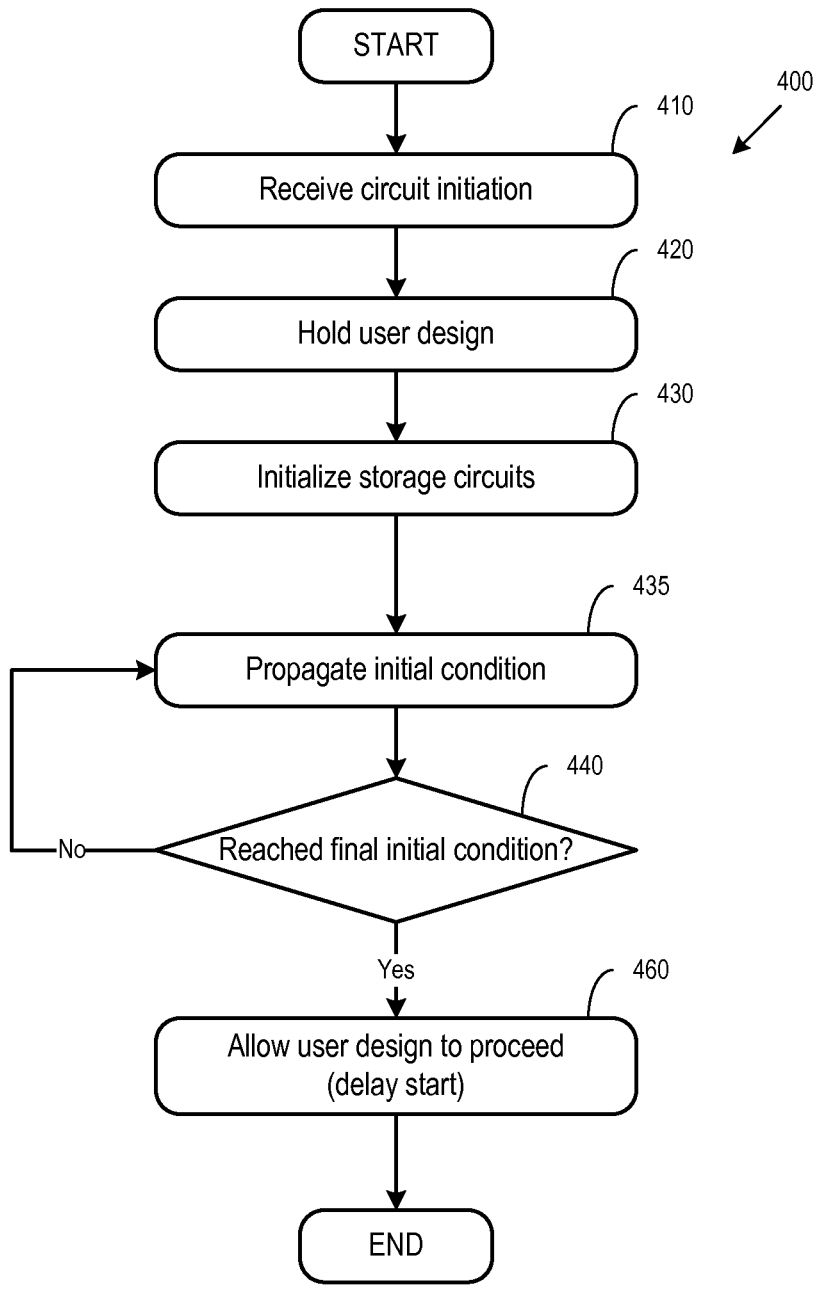
FIG. 4 conceptually illustrates a process for delaying the start of user design until the completion of initial condition computation.
Figure 5:
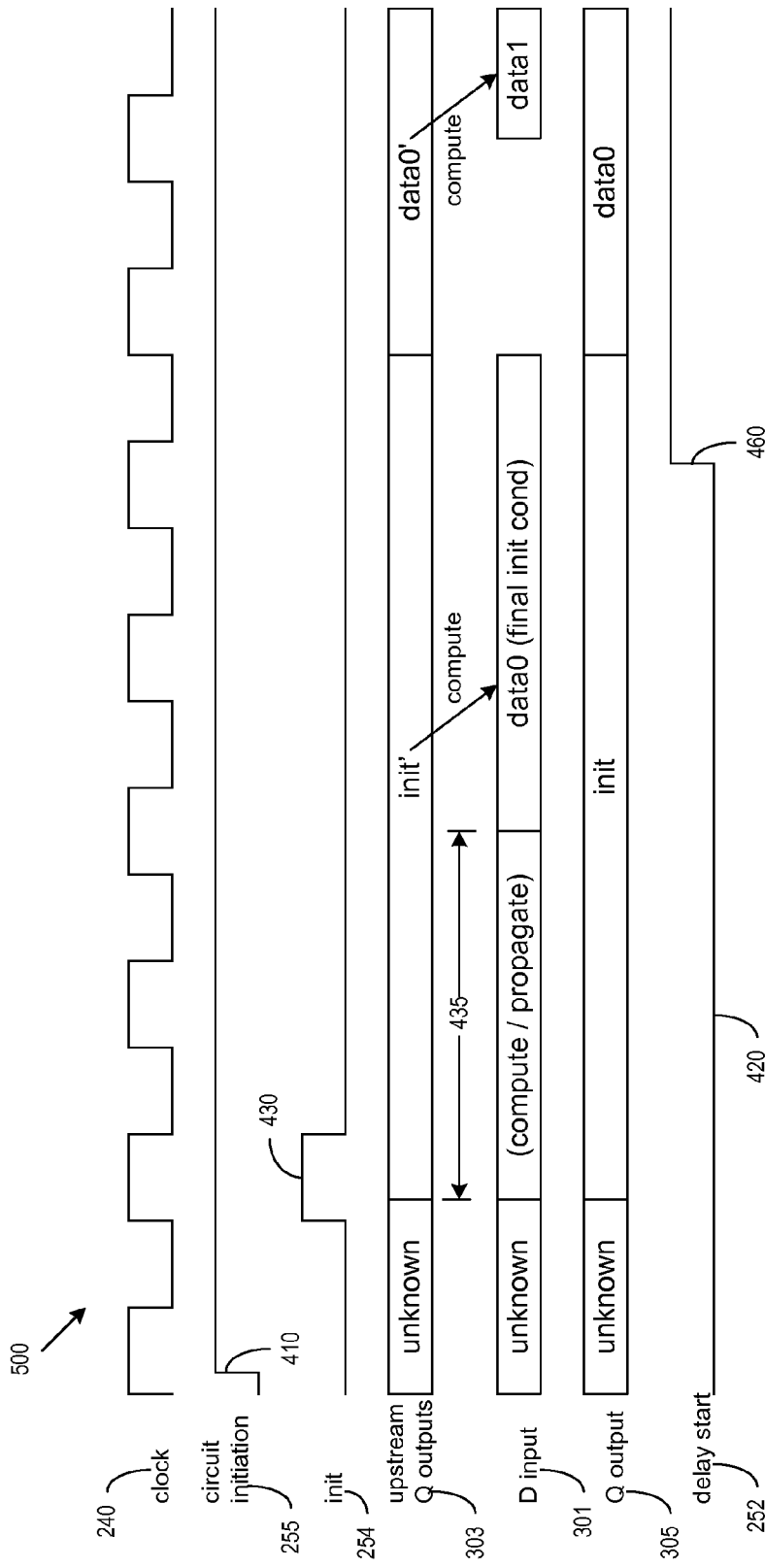
FIG. 5 illustrates a timing diagram that shows the relationship between the user design start sequencer and the storage circuits.

FIG. 4 conceptually illustrates a process 400 for delaying the start of user design execution until the completion of initial condition computation. In some embodiments, the process 400 is performed by the user design start sequencer 250. FIG. 4 will be described by reference to FIG. 5. FIG. 5 illustrates a timing diagram 500 that shows the relationship between the user design start sequencer 250 and the storage circuits (such as 300). The timing diagram 500 includes waveforms for signals generated and received by the user design start sequencer 250: the circuit initiation signal 255, the init signal 254, and the delay start signal 252. The timing diagram 500 also includes waveforms generated and received by the storage circuit 300: the Q output 305 of the storage circuit, the D input 301 of the storage circuit, and the clock signal 240. Additionally, the timing diagram 500 includes the waveform of the upstream Q outputs 303 produced by the storage circuits 210.

Before the start of the process 400 of FIG. 4, the delay start signal 252 is de-asserted or inactive, thereby holding the storage circuit 300 at a constant value. The Q output 305 of the storage circuit 300 and the upstream Q output 303 are both unknown because the storage circuits 210, 220, and 230 have not been initialized by the init signal 254. The D input 301 of the storage circuit 300 is also unknown, because the logic circuit 225, which feeds the D input 301, has yet to compute and propagate initial conditions from the upstream Q output 303.

The process starts when it receives (at 410) the circuit initiation signal 255. In some embodiments, the circuit initiation signal 255 is generated by a coordinator circuits in the IC that controls the sequencing and the timing of the start of user design operations. Some of these embodiments generate the circuit initiation signal 255 according to a timing sequence that ensures the user design (as implemented by the storage circuits 210, 220, 230 and logic circuits 215, 225, and 235) starts at the correct time relative to other operations taking place in the IC.

After receiving the circuit initiation signal 255, the process holds (at 420) the user design by de-asserting the delay start signal 252 to '0' if it has not done so already. Using the delay start signal to hold the user design ensures that the storage circuits (e.g., the storage circuits 210, 220, 230) in the user design would remain in the initial state after being initialized.

Next, the process initializes (at 430) the storage circuits by asserting the init signal 254. As illustrated in the timing diagram 500 of FIG. 5, the assertion of the init signal forces the storage circuits in the IC to their initial states. As a result, both the Q output 305 of the storage circuit 300 and the upstream Q outputs 303 (i.e., the Q outputs of storage circuits feeding the logic circuit 225) have been reset to initial state.

The process next propagates (at 435) and computes the initial condition based on the initial state of the storage circuits. In some embodiments, the initial condition computation is underway as soon as the init signal 254 resets the storage circuits to their initial states. In some other embodiments, the initial condition computation does not start until the process receives a signal for enabling the initial condition computation. In some of these other embodiments, the enabling of the initial condition computation is precisely timed so the result of the initial condition computation will be synchronized with the start of user design execution (i.e., when delay start 252 is asserted).

The process 400 computes the initial condition for the storage circuits by allowing the initial states at the storage circuits 210, 220, and 230 to propagate through the logic circuits 215, 225 and 235. Specifically, the logic circuit 225 is computing the initial conditions for the storage circuit 300 based on the initial state of the upstream Q output 303. The D input 301 of the storage circuit 300 would remain invalid until the logic circuit 225 completes the computation of the initial condition (i.e., reaching a final initial condition). While the initial condition is being computed, the delay start signal 252 is held at 0 to ensure that the storage circuits (including the storage circuit 300) do not clock in invalid data from the logic circuits (e.g, the logic circuits 225).

The process next determines (at 440) whether the logic circuits 215, 225 and 235 have finished computing the initial condition (i.e, reaching final condition). If so, the process transitions to 460. Otherwise the process returns to 435 to continue the initial condition computation by the logic circuits. In some embodiments, the process waits for a predetermined amount of time before transitioning to 460 such as when the logic circuits includes only purely combinatorial circuits and/or free running storage circuits. In some embodiments, the process waits for a specific indication that the input to the storage circuits has is valid (i.e., reaching final initial condition). Such an indication can be generated by a timer, or a counter that tracks or controls the states of the logic circuits when performing initial condition computation/propagation.

In some embodiments, the logic circuits 215, 225, and 235 include state machines, and the process 400 waits for the state machine to go through all necessary states before arriving at the correct initial condition. In some of these embodiments, the process 400 receives a copy of the states in order to determine whether the initial condition computation has completed. In some embodiments, the process is synchronized with the state machine (e.g., knowing exactly when the state machine starts to run) such that the process knows exactly when the logic circuits complete initial condition computation.

In some embodiments, the logic circuits 215, 225, and 235 include reconfigurable circuits, and the process 400 waits for the reconfigurable circuits to go through all necessary reconfiguration states before arriving at the correct initial condition. In some of these embodiments, the process receives a copy of the reconfiguration states in order to determine whether the initial condition computation has completed. Some of these embodiments are described below in Section II.

At 460, the process starts user design execution by allowing the user design to proceed by asserting the delay start signal 252 to '1'. Once the delay start becomes logic '1', storage circuits are free to clock in data and begin operation. As illustrated in by the timing diagram 500, once the delay start signal 252 is asserted, the data sitting at the D input 301 of the storage circuit 300 ('data0') is allowed to be clocked over to the Q output 305. After allowing the user design to start execution, the process 400 ends.

As illustrated in the timing diagram 500 of FIG. 5, the D input 301 to the storage circuit 300 is unknown and invalid until the logic circuits completes the computation of the initial condition. The purpose of the process 400 is to ensure that the D input 301 has the valid data from the logic circuits 225 (i.e., final initial condition) when the user design that incorporates the storage circuits 210, 220, and 230 are allowed to proceed and operate.

II. Computing Initial Conditions with Reconfigurable Circuits

A logic computation in a conventional logic circuit takes place when data from one set of storage circuits or IOs propagate through a set of combinational logic circuits. A user design in a conventional IC can therefore start execution as soon as the initial states in its storage circuits propagate through its combinational logic. A logic computation in a reconfigurable logic circuit, on the other hand, takes place over several reconfiguration states. The initial states in the storage circuits will therefore not propagate fully until after several clock cycles. Delaying the start of user design execution prevents the initial states in the storage circuits from being overwritten or updated while the reconfigurable circuits are loopering. This allows the reconfigurable logic circuits to properly compute the final initial condition for the start of user design execution based on the frozen initial states in conjunction with the loopering reconfiguration states.

In some embodiments, at least some of the storage circuits store user defined states. When initialized, these storage circuits initializes to initial states that are user defined (i.e., user defined initial states). In some embodiments, these user defined initial states are not hardwired in the IC, but are programmed by configuration data that are defined and provided by the user. By holding the storage circuits to the user defined initial states, these user defined initial states are able to propagate throughout the IC.

In some embodiments, a user design implemented with reconfigurable circuits is defined based on user design clock cycles. Each user design clock cycle includes several reconfiguration clock cycles (i.e., the reconfigurable circuits reconfigure multiple times within one user design clock cycle, and that each reconfiguration clock cycle is sub-cycle of the user design clock cycle). Furthermore, the start of the user design (i.e., the lifting of delay start) coincides with the first user design clock edge.

Figure 6:
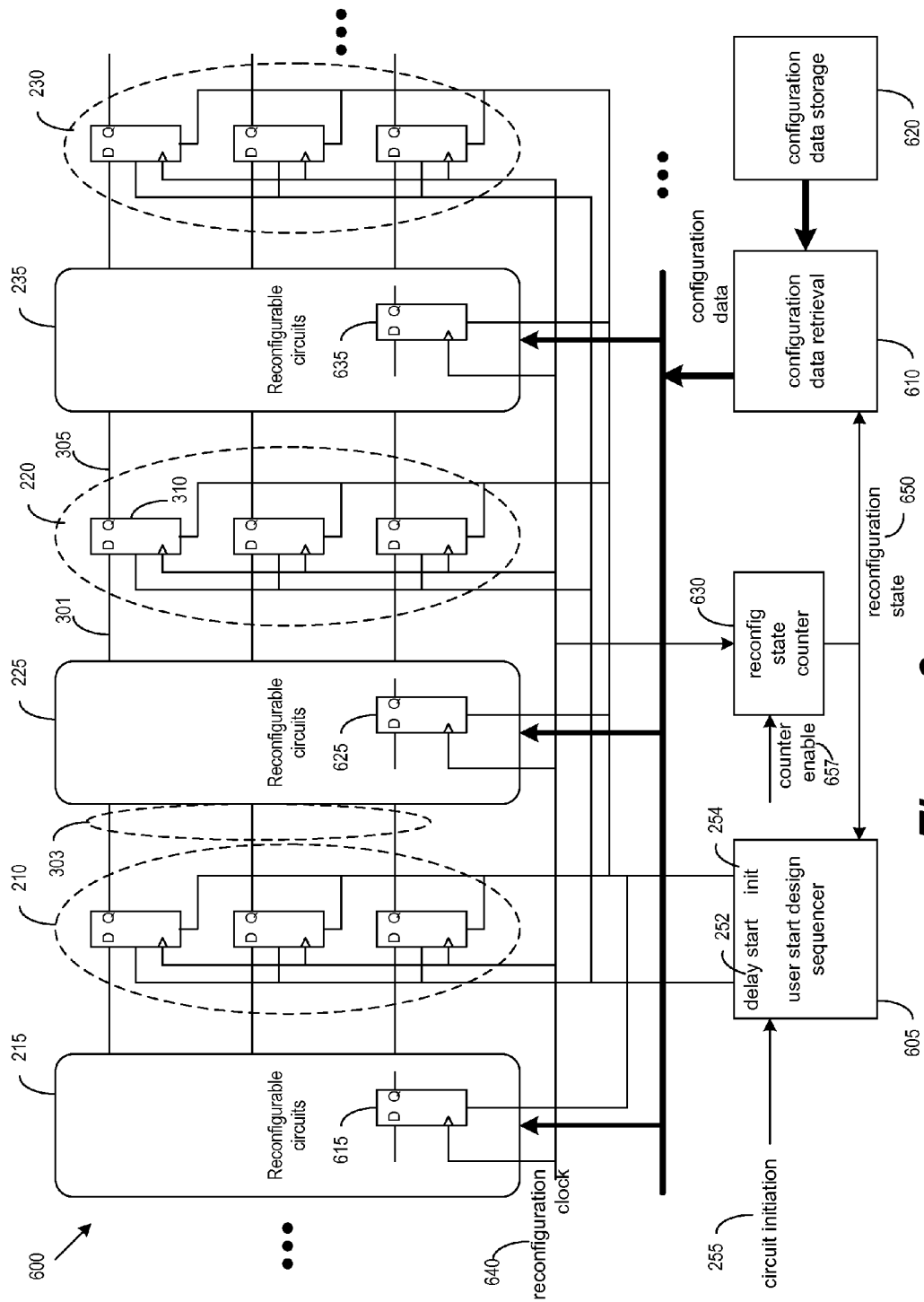
FIG. 6 illustrates an IC in which the computation of initial condition is performed by reconfigurable circuits.

As mentioned above, the logic circuits 215, 225, and 235 are implemented by reconfigurable circuits in some embodiments. FIG. 6 illustrates an IC 600 in which the computation of initial condition is performed by reconfigurable circuits in the logic circuits. Similar to the IC 200 of FIG. 2, the IC 600 includes the storage circuits 210, 220, 230, the logic circuits 215, 225, 235, and the a user design start sequencer 605. The logic circuits 215, 225, and 235 are reconfigurable circuits that implement a part of a user design. The reconfigurable circuits operate according to configuration data supplied by a configuration data retrieval circuit 610. The configuration data retrieval circuit 610 retrieves the configuration data from a configuration data storage circuit 620 based on a reconfiguration state supplied by a reconfiguration state counter 630.

In some embodiments, the logic circuits 215, 225, and 235 includes intermediate storage elements 615, 625 and 635 that store intermediate results of logic computations performed by the reconfigurable circuits. These stored intermediate results are then used by subsequent computations in later clock cycles. To compute the final initial condition that is valid for the start of user design execution, the reconfigurable circuits go through several reconfiguration states of computation based on the initial state held in the storage circuits. In each of the reconfiguration states, the intermediate storage circuits receive and store intermediate computation data. The stored intermediate computation data are then used by the computation of the subsequent cycle. The computed final initial condition is the cumulative result of all intermediate computation data that are successively computed and stored in each of the reconfiguration states. In other words, the computation of the final initial condition is the propagation of the initial states from the storage elements through the intermediate storage circuits to each of the reconfiguration states.

Unlike storage circuits 210, 220, and 230, the intermediate storage elements 615, 625, and 635 are not controlled by the delay start signal. In other words, the intermediate storage elements 615, 625, and 635 are free to clock in new data whether or not the storage elements 210, 220, and 230 are being held at their initial state by (the de-assertion of) the delay start signal. In some embodiments, the intermediate storage elements in the reconfigurable logic circuits are implemented similarly as the storage element 300 of FIG. 3, except that the intermediate storage elements do not receive the delay start signal for determining whether to accept new data/keep old data (i.e., the data input of the intermediate storage element goes directly to the D input of the flip-flop.) However, the init signal would initialize the intermediate storage elements to their initial states in some embodiments. One of ordinary skill would realize other types of storage circuits, such as memories and latches, can also be used as intermediate storage elements.

In some embodiments, the logic circuits 215, 225, and 235 includes sequential circuits that encompass some or all of the intermediate storage elements. The propagation of the initial states from the storage circuits 210, 220, and 230 through the logic circuits 215, 225, and 235 includes the sequencing of or computation by these sequential elements. The sequencing or computation is based on the initial state stored in the storage circuits, the intermediate computation results stored in the intermediate storage elements, the reconfiguration states, and/or other state information that are derived or propagated from the initial state. In some embodiments, the sequential elements that encompass the intermediate storage elements can include digital signal processing (DSP) modules, memory blocks, I/O blocks, first-in-first-out (FIFO) buffers, counters, address pointers, clock domain crossover circuitry, or other types of circuits with storage elements. In some embodiments, these storage elements include memories, flip-flops, latches or other storage circuits that store intermediate computation data during the propagation of the initial state.

The user design start sequencer 605 is similar to the user design start sequencer 250 of FIG. 2 in that it receives the circuit initiation signal 255 and controls the delay start signal 252 and the init signal 254. Unlike the user design start sequencer 250, the user design start sequencer 605 also receives the reconfiguration state 650 from the reconfiguration state counter 630. The reconfiguration state 650 is used by the sequencer 605 for determining whether the logic circuits have completed propagation/computation of initial condition.

The storage circuits 210, 220, 230 and the user design start sequencer 605 receive a reconfiguration clock 640 as clock. The user design operating in the IC 600 is defined according to a user design clock in some embodiments, while the reconfigurable circuits operate by using the reconfiguration clock, which is several times faster than the user clock. The faster running reconfiguration clock enables the reconfigurable circuits to reconfigure several times within a user design clock cycle.

The reconfiguration state counter 630 produces a reconfiguration state 650 that is used for selecting and retrieving the configuration data from the configuration data storage 620. The reconfiguration state 650 is also used by the user design start sequencer 605 to determine whether the reconfigurable circuit has completed computation of initial condition. In some embodiments, the reconfiguration state counter repeats after a certain count (e.g., terminal count), and the reconfigurable circuit accordingly "looper" its operations. In some embodiments, the computation of the initial condition is complete when the reconfiguration state counter 630 reaches the terminal count or when the reconfiguration state 650 loops back to the initial count. In some embodiments, the completed initial condition is only available at a particular count (e.g., the terminal count or the initial count) of the reconfiguration state counter, and the start of user design execution (i.e., assertion of the delay start signal 252) must be synchronized with this particular count in order for the user design to start with the correct initial condition.

The reconfiguration state counter 630 also receives a counter enable signal 657. The reconfiguration state counter 630 is allowed to advance count only when the counter enable signal 657 is asserted. In some embodiments, the counter enable signal is provided by circuitry that coordinates the reconfiguration states of different reconfigurable circuits within the IC.

The configuration data retrieval circuit 610 receives the reconfiguration state 650 and uses the received reconfiguration state 650 to retrieve configuration data from configuration data storage 620. As the reconfiguration state counter 630 increments on each reconfiguration clock, new configuration data is retrieved from the configuration data storage in each reconfiguration clock cycle in order to reconfigure the reconfigurable circuits in 215, 225, and 235.

Figure 7:
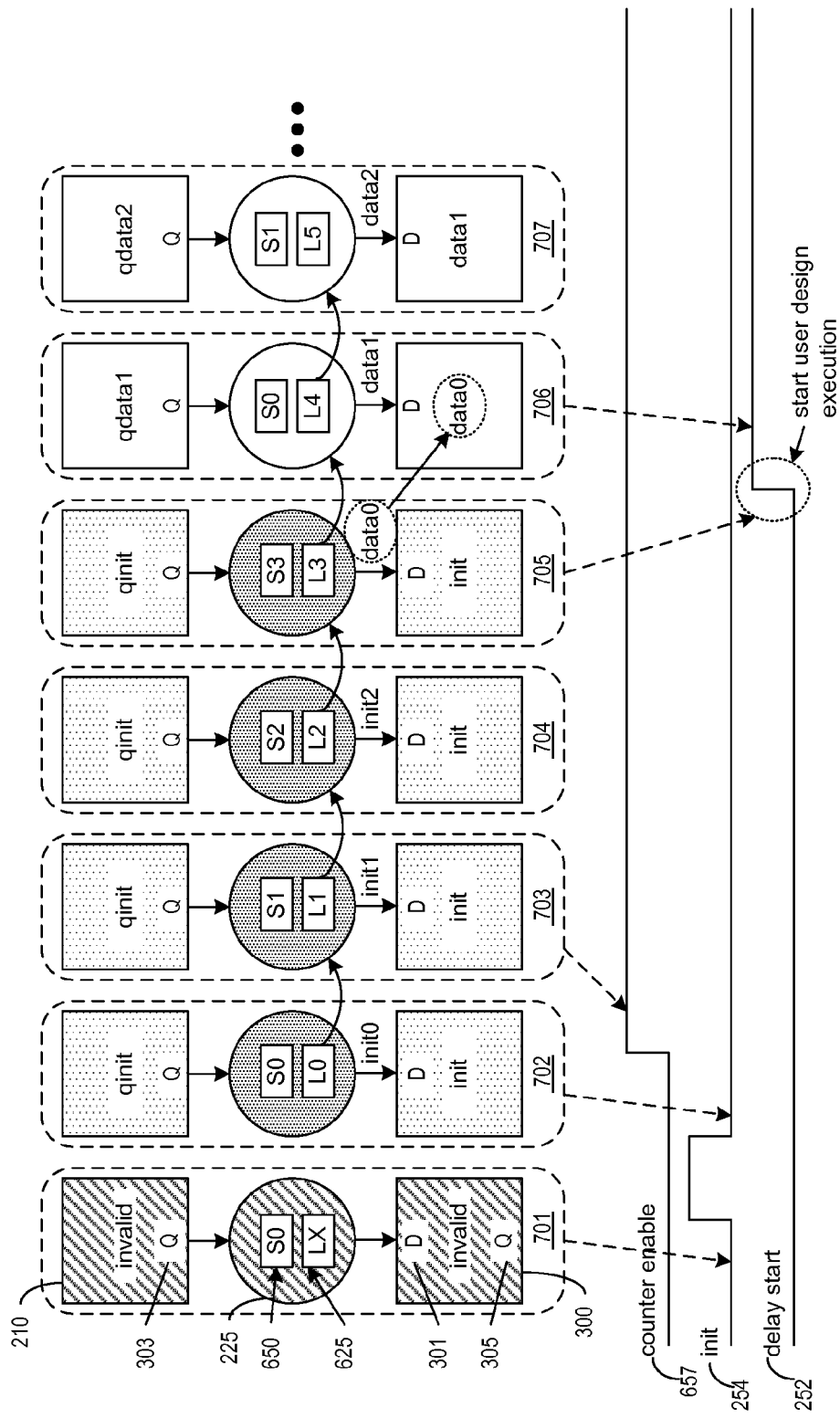
FIG. 7 illustrates an operation to start user design execution that uses reconfigurable circuits to compute/propagate initial conditions.

FIG. 7 illustrates an operation to start user design execution that uses reconfigurable circuits to compute/propagate initial conditions. FIG. 7 conceptually illustrates the storage circuits and logic circuits in different stages of an operation to start user design execution in the IC 600, in which the storage circuits (i.e., the first group of circuits) are held in an initial state while the reconfigurable circuits in the logic circuits (i.e., the second group of circuits) reconfigure every clock cycle to compute and propagate initial conditions, and the intermediate results of the computation are stored at intermediate storage element and propagated onto subsequent reconfiguration states until the final initial condition is reached.

FIG. 7 illustrates the delayed start of user design execution in nine stages 701-709, each of the stages correspond to a particular point in time in the timing diagram 750. Each of the stages includes graphical representations of the storage circuits 210 (upstream storage circuits), the logic circuits 225 (which includes reconfigurable circuits), and the storage circuit 300 (the downstream storage circuit). The logic circuits 225 receives as input from the Q output terminal 303 of the storage circuits 210, and the output of the logic circuits goes to the D input terminal 301 of the storage circuit 300. The graphical representation of the storage circuits 210 and 300 includes indications of the status of the data being stored in those storage circuits, while the graphical representation of the logic circuits 225 includes indications of the reconfiguration state 650 for the reconfigurable circuits in the logic circuits 225. The graphical representation of the logic circuits 225 also includes indications of the content of the intermediate storage elements 625 in the logic circuit 225.

FIG. 7 also includes a timing diagram 750 of the control signals involved in the control of the storage circuits and the logic circuits during the operation to start user design execution. The timing diagram 750 includes waveforms for the init signal 254, the delay start signal 252, and the counter enable signal 657. The "init" signal 254, when asserted, resets the storage circuits such as 210 and 300 into a known, initial state. The de-assertion of "delay start" signal prevents the storage circuits 210 and 300 from clocking in new value and causes the storage circuits to hold on to their initial state. The assertion of "delay start" signal allows the storage circuits 210 and 300 to clock in new data and starts user design execution. The de-assertion of the counter enable signal holds the reconfigurable circuits in the logic circuits 225 at an initial reconfiguration state. The reconfigurable circuits are allowed to advance state only when the counter enable signal 657 is asserted.

The stages of the operation to start user design execution that uses reconfigurable circuits to compute/propagate initial conditions will now be described. At the first stage 701, neither the init signal 254 nor the counter enable signal 657 have been asserted. The data being stored by the storage circuits 210 and 300 and the data being produced by the logic circuits 225 are all invalid because these circuits have not been initialized. The reconfiguration state 650 of the reconfigurable circuits in the logic circuits 225 are held at the initial reconfiguration state 'S0' and not allowed to advance by the de-assertion of counter enable signal 657. The content of the intermediate storage 625 are unknown ("LX").

At the second stage 702, the init signal has been asserted and the storage circuits 210 and 300 are reset to their initial states. The delay start signal is de-asserted, which causes the storage circuits 210 and 300 to be held at their initial states as long as the delay start signal remains de-asserted. The logic circuits 225 at this stage has yet to complete compute or propagate the initial state "qinit" held at the storage circuits 210, and hence output of the logic circuits 225 to the storage circuit 300 is invalid. Specifically, the reconfigurable circuits in the logic circuits 225 is still at reconfiguration state S0, and the output "init0" of the logic circuits 225 is not valid data for starting user design execution. The content of the intermediate storage 625 will become "L0", which is the result of the computation based on "qinit" held at the storage circuit 210 and the reconfiguration state S0.

At the third stage 703, the counter enable signal 657 has been asserted and the reconfigurable circuits in the logic circuits 225 are able to reconfigure by advancing from reconfiguration state S0 to reconfiguration state S1. The reconfigured logic circuits 225 continue the computation based on the "qinit" state being held at the output of the storage circuits 210 as well as the "L0" content of the intermediate storage 625 from the previous reconfiguration state S0. However, the logic circuit 225 at S1 has not completed computation/propagation of initial conditions, and the output of the logic circuits 225 "init1" is not valid data for starting user design execution. The content of the intermediate storage 625 will become "L1", which is the result of the computation based on "qinit" held at the storage circuit 210, the reconfiguration state S1, and the content of the intermediate storage 625 from the previous reconfiguration state.

At the fourth stage 704, the reconfigurable circuits in the logic circuits 225 reconfigure by advancing from reconfiguration state S1 to reconfiguration state S2. The reconfigured logic circuits 225 continue the computation based on the "qinit" state being held at the output of the storage circuits 210. However, the logic circuit 225 at S2 has not completed computation/propagation of initial conditions, and the output of the logic circuits 225 "init2" is not valid data for starting user design execution. The content of the intermediate storage 625 will become "L2", which is the result of the computation based on "qinit" held at the storage circuit 210, the reconfiguration state S2, and the content of the intermediate storage 625 from the previous reconfiguration state.

At the fifth stage 705, the reconfigurable circuits in the logic circuits 225 reconfigure by advancing from reconfiguration state S2 to reconfiguration state S3. The reconfigured logic circuits 225 continue the computation based on the "qinit" state being held at the output of the storage circuits 210 as well as the content (L2) stored in the intermediate storage element 625 from the previous reconfiguration state. In this particular example, the reconfigurable circuits has completed the computation of initial conditions, and the output "data0" produced by the logic circuits 225 is valid data for starting user design execution.

In some embodiments, the reconfigurable circuit completes its initial condition computation at the last reconfiguration state of the reconfiguration looper. In the example of FIG. 7, this last reconfiguration state in the reconfiguration looper is S3, as the reconfiguration circuits goes through the sequence of S0→S1→S2→S3 before loopering back to S0 to repeat the same sequence. Some embodiments therefore assert delay start at this last reconfiguration state and start user design execution.

At the sixth stage 706, the assertion of the delay start signal has allowed both the upstream storage circuit 210 and the downstream storage circuit 300 to clock in and store new inputs. The storage circuit 210 is no longer held at its initial state of "qinit", but instead stores a new data "qdata1". The storage circuit 300 has clocked in "data0" produced by the logic circuits 225 during reconfiguration state S3. The logic circuits 225 are no longer computing/propagating initial conditions since neither the upstream storage circuit 210 nor the downstream storage circuit 300 are held in their initial states by delay start.

At the seventh stage 707, the circuits 210, 225 and 300 continue to perform the user defined operations as none of the circuits are held in their initial state or prevented from clock-in new data. The reconfiguration circuits in the logic circuits 225 has advanced to reconfiguration state S1. After the seventh stage, the circuits will continue to perform the user defined operations, and the reconfigurable circuits in the logic circuits 225 will continue to advance reconfiguration state to S2, S3 before loopering back to S0, S1 . . . and so on. Likewise, the intermediate storage element will continue to pass intermediate computation result from one reconfiguration state to the next.

In this example, the start of user design execution occur (i.e., asserting delay start) when the reconfiguration state first reached the last reconfiguration state S3. Some embodiments assert the delay start 252 later to coincide with a later instance of reconfiguration state S3. In such circumstances, the reconfiguration state loopers back to the first reconfiguration state (S0) after the stage 705, and the output of the logic circuits 225 will become invalid until the reconfiguration state once again reaches the last reconfiguration state in the looper (S3).

Figure 8:
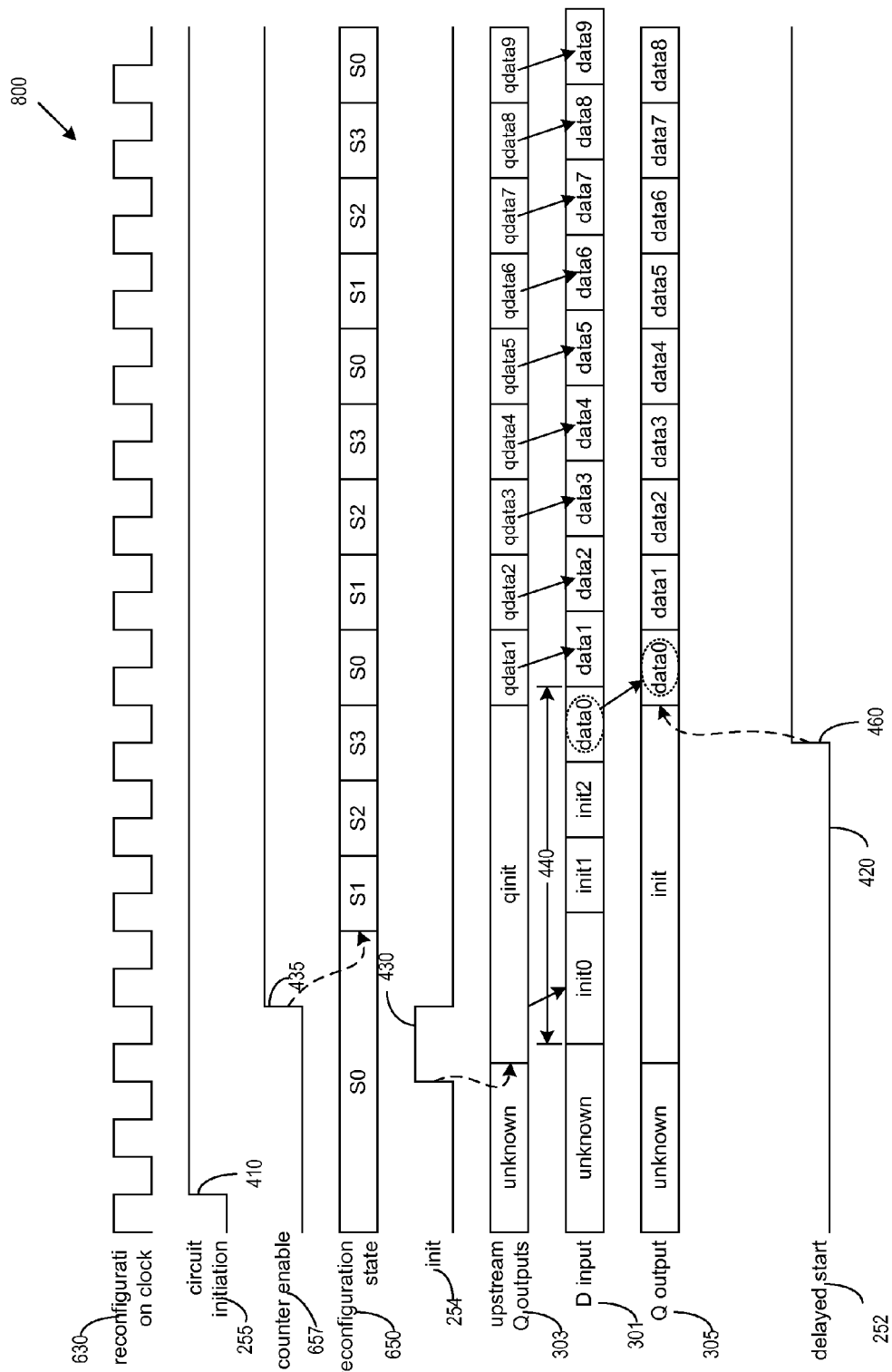
FIG. 8 illustrates a timing diagram that shows relationship between the user design start sequencer and the storage circuits when the logic circuits providing the input to the storage circuits are reconfigurable circuits.

FIG. 8 illustrates a timing diagram 800 for the operation to start user design execution as illustrated in FIG. 7, which uses reconfigurable circuits to compute/propagate initial conditions. The timing diagram 800 shows relationship between the user design start sequencer 605 and the storage circuits 210, 300 and the logic circuits 225, which includes reconfigurable circuits.

The timing diagram 800 is similar to the timing diagram 500 of FIG. 5, as it includes the waveforms for the circuit initiation signal 255, the init signal 254, the delay start signal 252, the Q output 305 of the storage circuit 300, the D input 301 of the storage circuit 300, and the upstream Q outputs 303 produced by the storage circuits 210. In addition, the timing diagram 800 includes waveforms of the reconfigurable circuits: the reconfiguration clock 640, the reconfiguration state 650, and the counter enable signal 657.

The timing diagram 800 is described by referring to operations performed by the process 400 of FIG. 4, since the user design start sequencer 605 performs the process 400 in some embodiments. As shown in FIG. 8, prior to assertion of user design start, the Q output 305 and the upstream Q output 303 are both unknown because the storage circuits in 210, 220, and 230 have not been initialized by the init signal 254. The D input 301 of the storage circuit 300 is also unknown, because the initial condition has yet to be computed and propagated by the logic circuit 225, which receive inputs from the upstream Q output 303 that is currently unknown. The reconfiguration state 650 is being kept at initial state S0 by the de-assertion of the counter enable signal 657. The user design start sequencer 605 keeps delay start signal 252 at '0' to prevent the storage circuits from clocking in invalid data.

Upon receiving the circuit initiation signal 255 at the operation 410, the user design start sequencer 605 asserts the init signal 254 at operation 430 to reset the content of the storage circuits 300 (i.e., its Q output 305) from 'unknown' to 'init' and the content of the storage circuits 210 (i.e., upstream Q output 303) from unknown to "qinit". The counter enable 657 signal has been asserted to allow reconfiguration state 650 to proceed from S0 to other states (S1, S2, etc.). As the reconfiguration state changes, the reconfigurable circuits reconfigure to perform different functions according to the supplied configuration data.

The D input 301 is the output of the reconfigurable circuit in logic circuits 225 based on the reconfiguration state 650 and at least partially on the upstream Q outputs 303 produced by storage circuits in 210. As reconfiguration state changes from S0 to S3, so does the output of the reconfigurable circuits (i.e., the D input 301). When the upstream Q outputs 303 is held at 'qinit', the D input 301 toggles through 'init0', 'init1', 'init2' and then to 'data0' during reconfiguration states S0-S3. When the upstream Q outputs 303 toggle freely (after assertion of delay start), the output of the logic circuit 225 (i.e., the D input 301) reflects the toggling of the upstream Q outputs 303 in addition to the loopering of the reconfiguration states.

The de-assertion of the delay start signal 252 holds the storage circuits at their initial state and allows the reconfigurable circuit to go through states S0-S2 without having to worry about invalid intermediate data being clocked in by the storage circuits. The assertion of the delay start signal 252 is timed so the valid data (i.e., final initial condition) available at the last reconfiguration state can be latched in or clocked in by the storage circuits. In the example of FIG. 8, the user design start sequencer 605 accomplishes this by asserting the delay start signal 252 only when the reconfiguration state has reached S3 (at operation 460), upon which the final initial condition "data0" computed by the logic circuits 225 is clocked in by the storage circuit 300. Once the delay start signal is asserted, the storage circuits are free to latch in or clock in new input as the reconfigurable circuits go through the same reconfiguration states to perform new computations.

III. Coordinating Delayed Start of User Design Execution

In some embodiments, different parts of the IC or electronic system require different sequences of initialization prior to execution of the user design. In some these embodiments, the initialization of the different part of the IC have to be coordinated. A particular part of the IC including storage and logic circuits that have completed propagation/computation of initial conditions may have to wait for other parts of the IC to be ready before starting user design execution (i.e., asserting delay start) in order for the system to function correctly. In some of these embodiments, the start of user design execution for the particular part of the IC not only depends on whether its logic circuits has completed the computation/propagation of initial conditions, but also depends on whether other parts of the system is ready for user design execution to start by the particular part of the IC.

For some of these embodiments, the initialization of the different parts of the IC is centrally coordinated by an initialization circuitry that starts to operate before all other circuits in the IC after power up. In some embodiments, the circuit initiation signal 255 and the counter enable signal are both provided by such a central initialization controller. In some embodiments, the central initialization controller also provides indication of whether the system is ready for user design execution to start.

A. Circuit Initiation

The circuit initiation signal 255 starts a sequence that ends with the delayed start of user design execution. In some embodiments, the circuit initiation signal is asserted soon after power-up of the IC. Some embodiments, on the other hand, coordinates the initialization of different parts of the IC by controlling when to start the sequence that lead to (delayed) start of user design execution of at least some of those different parts. In some of these embodiments, the circuit initiation signal is asserted to a particular part of the IC only when the system is ready for the particular part of the IC to start user design execution.

B. Counter Enable

As mentioned above, the counter enable signal 657 controls the reconfigurable state loopering (e.g., by controlling the reconfiguration state counter 630) for some embodiments that include reconfigurable circuits. In some embodiments, the counter enable 657 signal is asserted soon after power-up of the IC. In some embodiments, the counter enable signal 657 is provided to all reconfigurable circuits of the IC to ensure that all reconfigurable circuits in the IC are synchronized to have the same reconfiguration state.

C. System Ready

Figure 9:
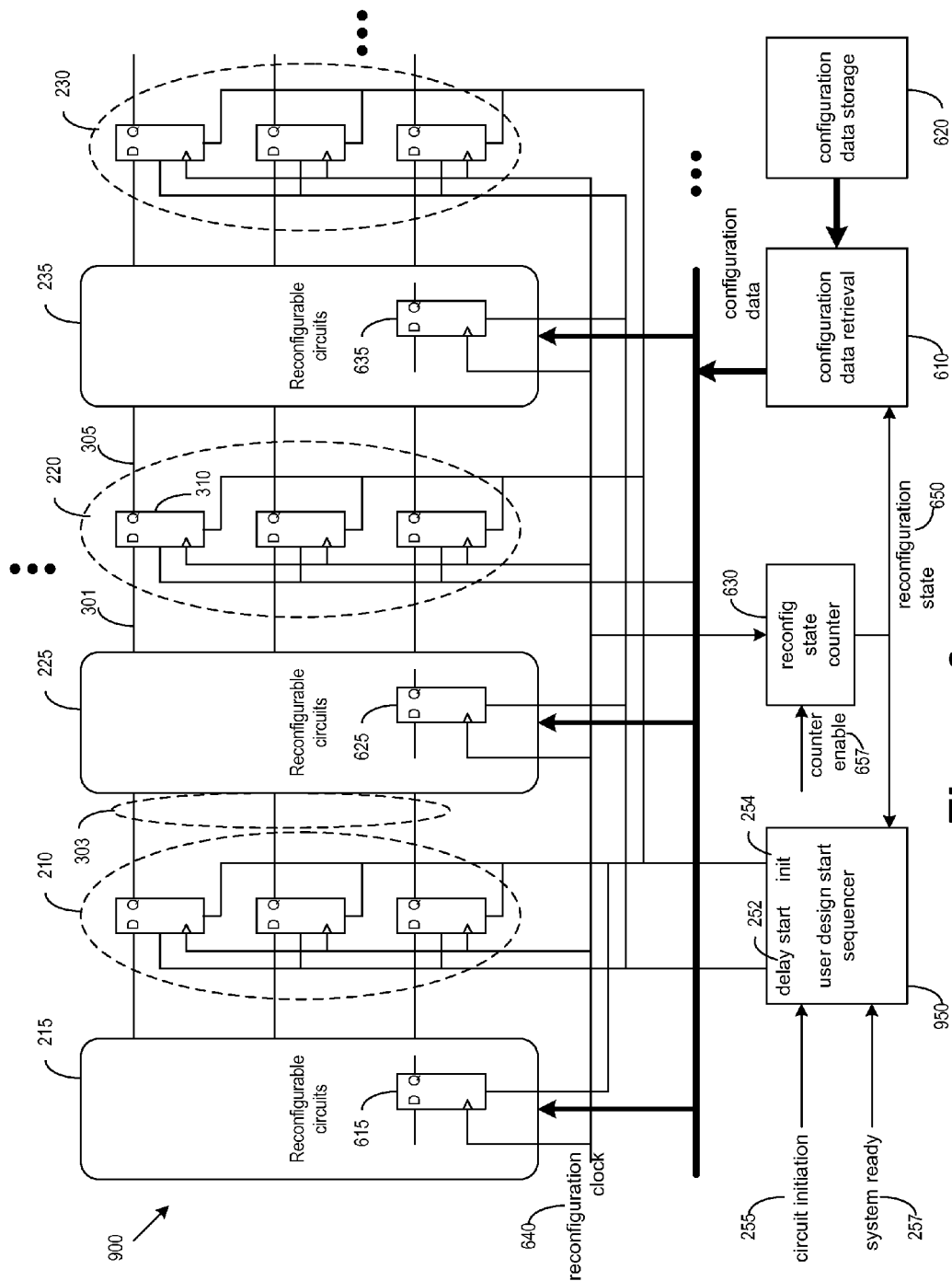
FIG. 9 illustrates an IC that includes logic circuits and storage circuits whose start of user design execution are controlled by a system ready signal.

Instead of or in addition to using the circuit initiation signal 255 for controlling when to start user design execution, some embodiments use a system ready signal to indicate whether the system is ready for a particular part of the IC to start user design execution. The system ready indication can be an event, or simply a timer that expires at a known initial state propagation time. FIG. 9 illustrates an IC 900 that includes logic circuits and storage circuits whose start of user design execution are controlled by a system ready signal. The IC 900 is similar to the IC 600. It includes the storage circuits 210, 220, 230, the logic circuits 215, 225, and 235. The logic circuits 215, 225, and 235 include reconfigurable circuits that operate according to configuration data supplied by a configuration data retrieval circuit 610. The configuration data retrieval circuit 610 retrieves the configuration data from a configuration data storage circuit 620 based on a reconfiguration state supplied by a reconfiguration state counter 630.

The IC 900 includes a user design start sequencer 905. The user design start sequencer 905 is similar to the user design start sequencer 605 of FIG. 6 in that it receives the circuit initiation signal 255 and controls the delay start signal 252 and the init signal 254 based on the reconfiguration state 650. However, the user design start sequencer 905 additionally receives a system ready signal 257, which indicates whether the rest of the system or IC is ready for the storage circuits 210, 220, 230 and the logic circuits 215, 225, and 235 to start user design execution.

Figure 10:
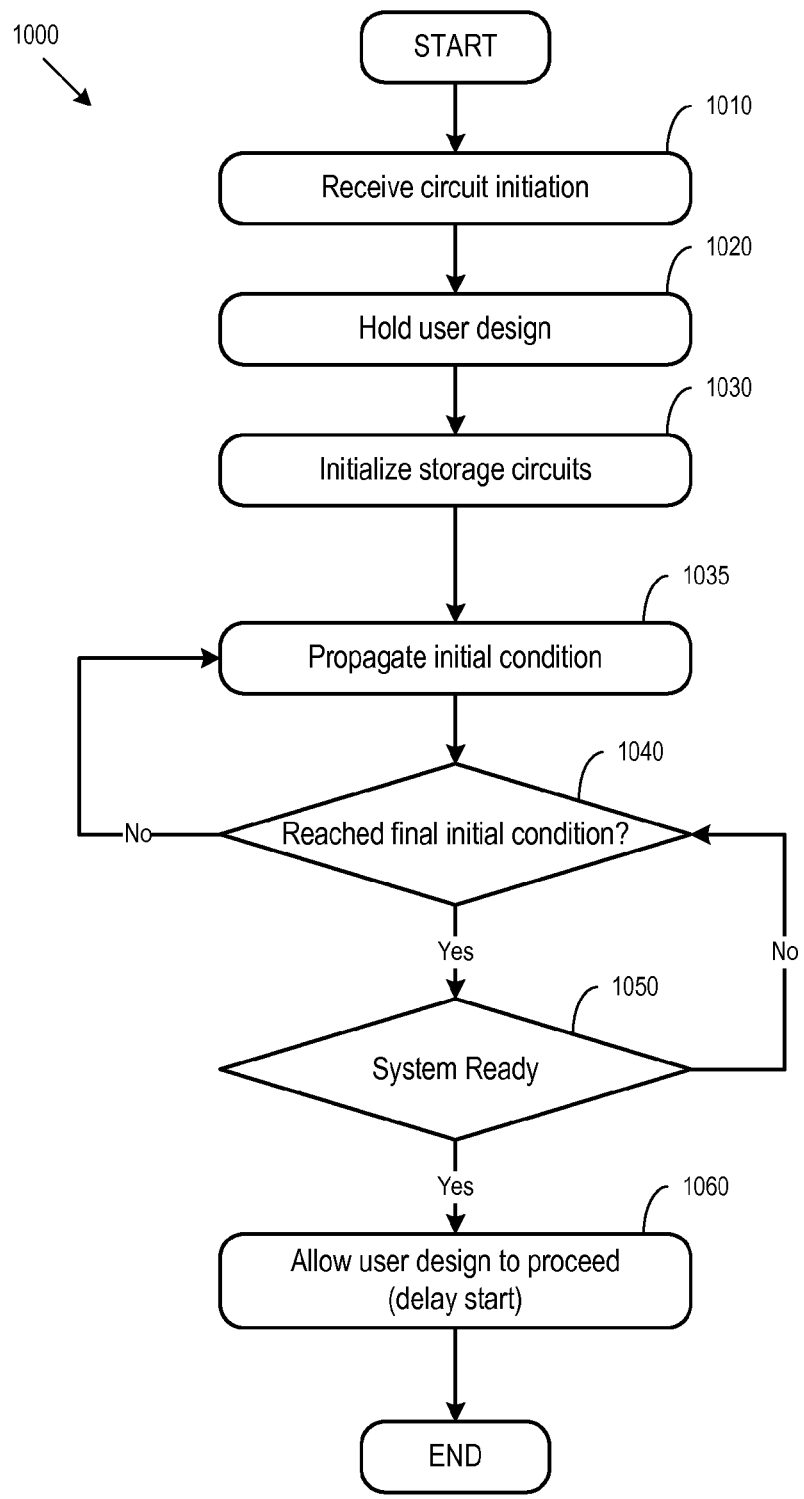
FIG. 10 conceptually illustrates a process for delaying the start of user design execution until the completion of initial condition computation and until the system is ready for some embodiments.

FIG. 10 conceptually illustrates a process 1000 for delaying the start of user design execution until the completion of initial condition computation and until the system is ready for some embodiments. For the example IC 900, the user design start sequencer 905 performs a process that is similar to the process 1000.

Before the start of the process 1000, the delay start signal 252 is de-asserted or inactive, thereby holding the storage circuits 210, 220, and 230 at a constant value. The Q output 305 of the storage circuit 300 and the upstream Q output 303 are both unknown because the storage circuits 210, 220, and 230 have not been initialized by the init signal 254. The D input 301 of the storage circuit 300 is also unknown, because the logic circuit 225, which feeds the D input 301, has yet to compute and propagate initial conditions from the upstream Q output 303. In some embodiments, the counter enable signal 657 has been asserted, hence the reconfigurable circuits in the logic circuits have already started reconfiguring themselves according to loopering reconfiguration states. In some embodiments, the counter enable signal 657 has not been asserted and reconfigurable circuits will not start reconfiguring until later in the process.

The process starts when it receives (at 1010) the circuit initiation signal 255. In some embodiments, the circuit initiation signal 255 is generated by a coordinator circuits in the IC that controls the sequencing and the timing of the start of user design operations. Some of these embodiments generate the circuit initiation signal 255 according to a timing sequence that ensures the user design (as implemented by the storage circuits 210, 220, 230 and logic circuits 215, 225, and 235) starts at the correct time relative to other operations taking place in the IC.

After receiving the circuit initiation signal 255, the process holds (at 1020) the user design by de-asserting the delay start signal 252 to '0' if it has not done so already. Using the delay start signal to hold the user design ensures that the storage circuits (e.g., the storage circuits 210, 220, 230) in the user design would remain in the initial state after being initialized.

Next, the process initializes (at 1030) the storage circuits by asserting the init signal 254. As a result, both the Q output 305 of the storage circuit 300 and the upstream Q outputs 303 (i.e., the Q outputs of storage circuits feeding the logic circuit 225) have been reset to initial state. The process next propagates (at 1035) and computes the initial condition based on the initial state of the storage circuits. In some embodiments, the initial condition computation is underway as soon as the init signal 254 resets the storage circuits to their initial states. In some other embodiments, the initial condition computation does not start until the process receives a signal for enabling the initial condition computation. In some of these other embodiments, the enabling of the initial condition computation is precisely timed so the result of the initial condition computation will be synchronized with the start of user design execution (i.e., when delay start 252 is asserted).

The process 1000 computes the initial condition for the storage circuits by allowing the initial states at the storage circuits 210, 220, and 230 to propagate through the logic circuits 215, 225 and 235. Specifically, the logic circuit 225 is computing the initial conditions for the storage circuit 300 based on the initial state of the upstream Q output 303. The D input 301 of the storage circuit 300 would remain invalid until the logic circuit 225 completes the computation of the initial condition (i.e., reaching a final initial condition). While the initial condition is being computed, the delay start signal 252 is held at 0 to ensure that the storage circuits (including the storage circuit 300) do not clock in invalid data from the logic circuits (e.g, the logic circuits 225).

For logic circuits that include reconfigurable circuits such as those described above in Section II, the reconfigurable circuits reconfigure every clock cycle according to the loopering reconfiguration states and the retrieved configuration data to perform the computation. In some embodiments, the counter enable signal 657 has already been asserted prior to the start of the process and the reconfigurable circuits are already reconfiguring. In some embodiments, the reconfiguration state will not advance and the computation of initial condition will not be able to proceed until the counter enable signal 657 is asserted to allow the reconfiguration state to advance and looper.

The process next determines (at 1040) whether the logic circuits 215, 225 and 235 have finished computing the initial condition (i.e, reaching final condition). If so, the process transitions to 1050. Otherwise the process returns to 1035 to continue the initial condition computation by the logic circuits. In some embodiments, the process waits for a predetermined amount of time before transitioning to 1050. In some embodiments, the process waits for a specific indication that the input to the storage circuits has is valid (i.e., reaching final initial condition or the terminal count of the reconfiguration looper). Such an indication can be generated by a timer, or a counter that tracks or controls the states of the logic circuits when performing initial condition computation/propagation. In the example ICs 600 and 900, this indication is provided by reconfiguration state 650.

At 1050, the process determines whether the rest of the system is ready for the start of user design execution by this particular part of the IC. In some embodiments, this indication is provided by a specific signal such as the system ready signal 257 into the user design start sequencer 950. In some embodiments, the process 1000 uses a timer or other indications for determining whether the system is ready for the start of user design execution. If the system is ready, the process proceeds to 1060. Otherwise the process returns to 1040 and wait for the completion of initial condition computation. In some embodiments, if the system is not ready when the final initial condition has been reached, the loopering reconfigurable states would continue to advance and looper back to the first reconfiguration state. The final initial condition at the output of the logic circuits would no longer be available. In these instances, the process will have to compute/propagate initial condition once again by going through the reconfiguration states and wait for the next final initial condition and see if the system is ready.

At 1060, the process starts user design execution by allowing the user design to proceed by asserting the delay start signal 252 to '1'. Once the delay start is asserted, storage circuits are free to clock in data and begin operation. After allowing the user design to start execution, the process 1000 ends.

In the example of FIGS. 7 and 8, the delay start signal 252 is asserted as soon as the initial condition computation is completed. In other words, the user design execution starts as soon as the reconfiguration state reaches the terminal count of the looper (S3). Some embodiments wait two or more iterations of the reconfiguration looper before asserting delay start and start user design execution. Some embodiments wait for multiple iterations of the reconfiguration looper before starting user design execution because reconfigurable circuits may not have started from the initial reconfiguration state (S0) when the computation of initial condition started.

Some embodiments wait for multiple iterations of reconfiguration looper because the system is not ready. The system ready signal 257 can arrive after one or several iterations of the reconfiguration looper. In these instances, the delay start signal 257 would wait for next opportunity (e.g., the terminal count or the initial count of reconfiguration looper) to assert and start the user design. In these instances, multiple iterations of reconfiguration loops would have taken place before system ready signal is received and the delay start signal asserted.

Figure 11:
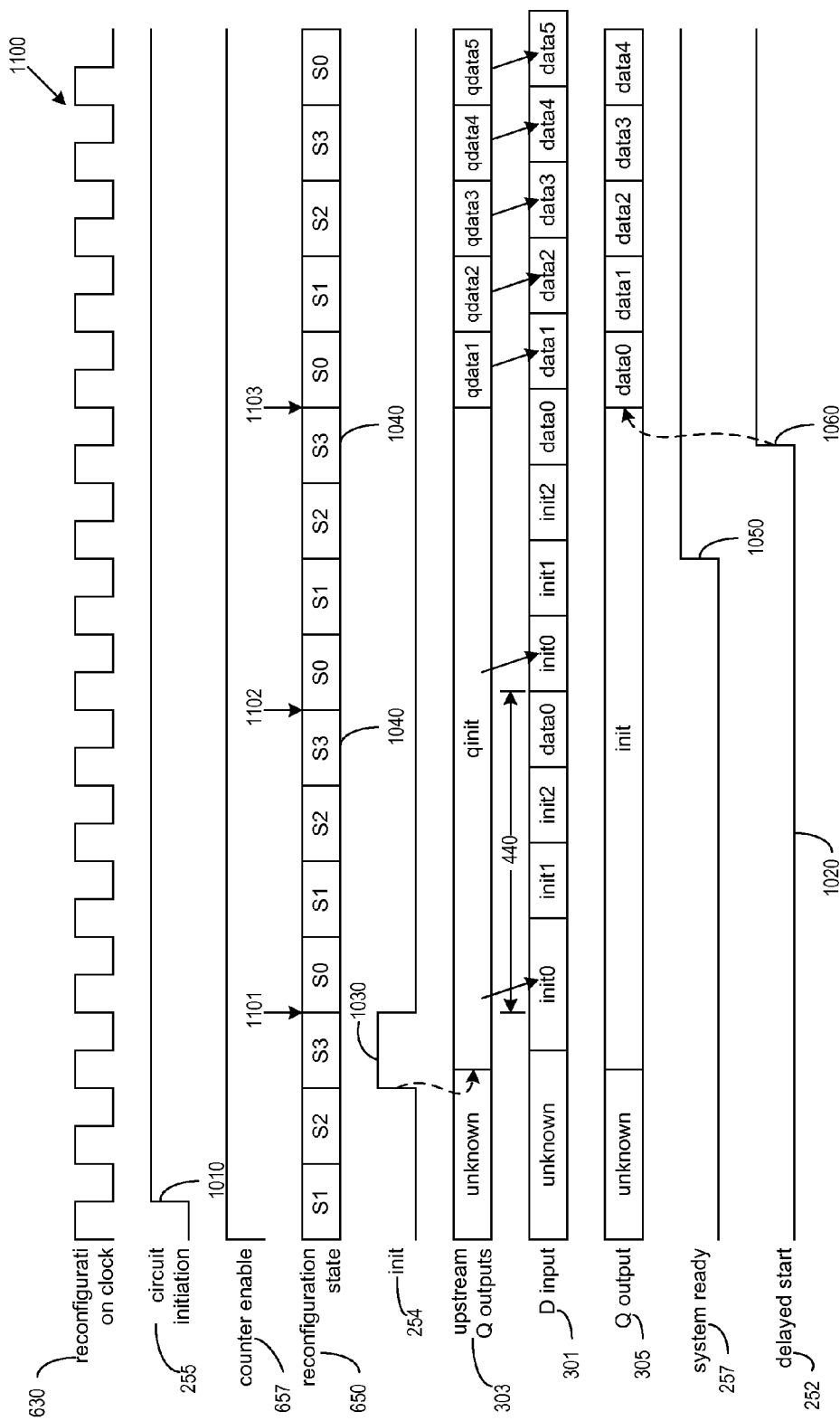
FIG. 11 illustrates a timing diagram in which the delay start signal is asserted after multiple iterations of reconfiguration loopering.

FIG. 11 illustrates a timing diagram 1100 in which the delay start signal is asserted after multiple iterations of reconfiguration loopering. The timing diagram 1100 includes the waveforms for the same set of signal as the timing diagram 800. In addition, the timing diagram also includes the waveform of the system ready signal 257.

As illustrated, the counter enable signal 657 is asserted to allow the reconfiguration state 650 to looper. Once the init signal 254 is asserted, the storage circuits are reset and held at the initial state. Specifically, the Q output 305 is reset to 'init' and the upstream Q output 303 is reset to 'qinit'. Based on the 'qinit' of the upstream Q outputs 303 (i.e., the initial state), the reconfigurable circuits starts to computes the initial condition at time 1101 when the reconfiguration state 650 is at S0. As the reconfiguration states 650 go through S0, S1, S2, and S3, the D input 301 changes from 'init0', 'init1', 'init2', and 'data0', respectively. The completed initial condition is 'data0', which is available when reconfiguration state 650 reaches S3 at time 1102.

The reconfiguration state 650 completes the first iteration of loopering at time 1102 and the second iteration of loopering at time 1103. However, the delay start signal 252 is not released until 1103, just before the start of third iteration of loopering. In some embodiments, each iteration of loopering produces identical final initial condition as long as the storage circuits (e.g., 210, 220, and 230) are prevented from latching in new data by the delay start signal 252 and holding on to the same initial state. The assertion of the delay start signal 252 is delayed until the third iteration of the reconfiguration state because the system ready signal 257 is not received until after the start of the second iteration at 1102.

D. Global Reset

The circuit initiation signal 255 is a signal that starts the user design start sequencer 905. The user design start sequencer 905 in turn asserts the init signal 254 to reset the storage circuits (e.g., 210, 220, and 230) while controlling the delay start signal 252 so the storage circuits is prevented from clocking in new data until initial condition computation has completed. However, the user design start sequencer 905 can be implemented differently. Instead of receiving the user design start signal 255 that commands the user design start sequencer to commence initial condition computation sequence, the user design start sequencer in some embodiments receives a global (or regional) reset signal that is used to reset storage circuits in the IC. In some embodiments, the global reset signal is a master reset signal coming from outside of the chip that is distributed throughout the IC. In some embodiments, the global reset signal is a reset signal that is derived from the master reset signal. In some of these embodiments, the global reset signal is only distributed within a particular region of the IC.

The reception of the global reset signal forces the user design start sequencer 250 into an initial state. The release of the global reset signal allows the user design start sequencer to advance through states that control the timing of the init signal 254, the user design enable signal 257, and the delay start signal 252.

Figure 12:
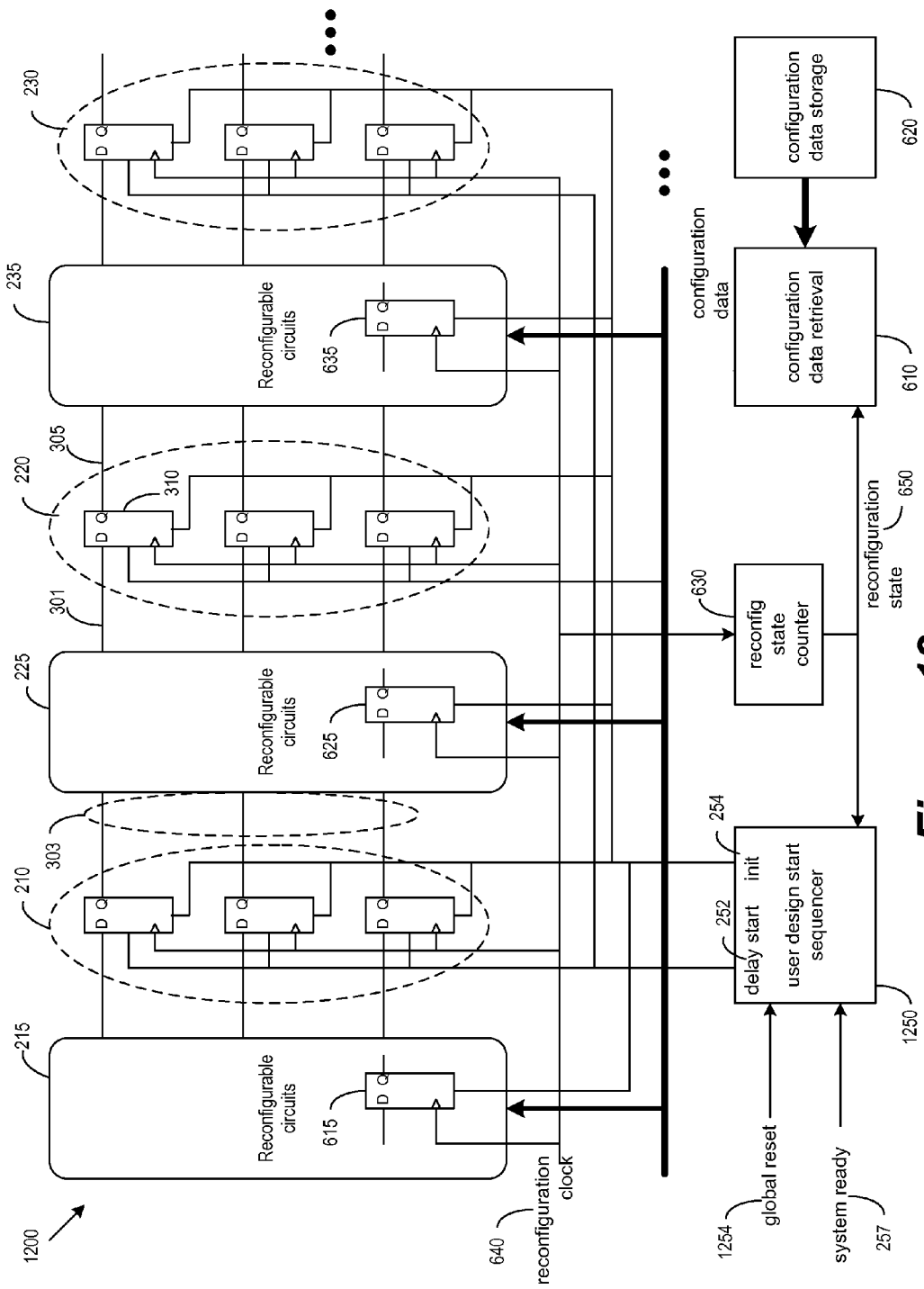
FIG. 12 illustrates an IC that delays the start of user design until the completion of initial condition computation, in which the user design start sequencer is controlled by a global reset signal.

FIG. 12 illustrates an IC 1200 that delays the start of user design until the completion of initial condition computation, in which the user design start sequencer is controlled by a global reset signal. As illustrated, the IC 1200 is similar to the IC 900, except that the IC 1200 includes a user design start sequencer 1250 that receives a global reset signal 1254. Based on the received global reset signal 1254 and the system ready signal 257, the user design start sequencer 1250 controls the timing of the init signal 254 and the delay start signal 252.

Figure 13:
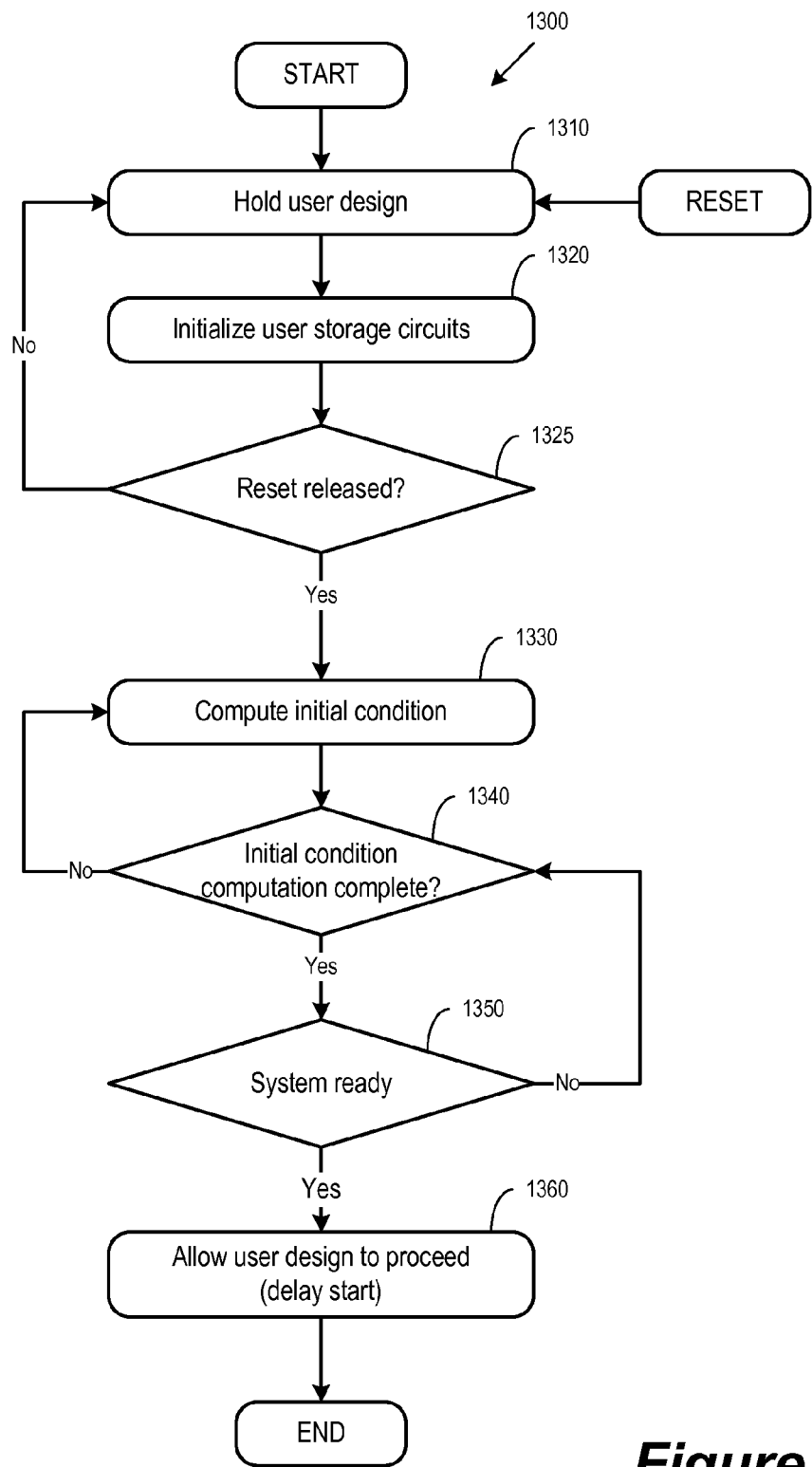
FIG. 13 conceptually illustrates a process for delaying the start of user design until the completion of initial condition computation based on a global reset signal.

FIG. 13 conceptually illustrates a process 1300 for delaying the start of user design until the completion of initial condition computation based on a global reset signal. The process can be performed by a user design start sequencer (such as the user design start sequencer 1250) that is controlled by the global reset signal. The process 1300 starts when it receives a global reset signal. In some embodiments, a sequencer that receives such a global reset signal immediately (or after a clock edge) goes into its initial reset state no matter what state it is originally in. After receiving the global reset, the process 1300 proceeds to 1310.

The process 1300 holds (at 1310) the user design by de-asserting the delay start signal and initializes (at 1320) user storage circuits. Next, the process waits (at 1325) for the global reset to be released. Once the reset is released, the process proceeds to 1330. Upon the release of the reset signal, the sequencer is at its initial state and ready to proceed to other states for controlling the computation of initial conditions. If the reset signal is still asserted, the process returns to 910 to continues to hold the user design and keep the storage circuits in initialized state.

At 1330, the process computes the initial condition for the storage circuits by allowing the initial states at the storage circuits to propagate through the logic circuits. While the initial condition is being computed, the delay start signal is held at 0 to ensure that the storage circuits do not clock in invalid data.

The process next determines (at 1340) whether the logic circuits have finished computing the initial condition. If so, the process transitions to 1350. Otherwise the process returns to 1330 to continue the initial condition computation by the logic circuits. In some embodiments, the process waits a predetermined amount of time before transitioning to 1350. In some embodiments, the process waits for a specific indication that the input to the storage circuits is valid. In some embodiments, the logic circuits include reconfigurable circuits, and the process waits for the reconfigurable circuits to go through all necessary reconfiguration states to arrive at the valid final initial condition for start of user design execution.

After completion of the initial condition, the process determines (at 1350) whether the system is ready to start the user design. As mentioned earlier, the IC in some embodiments needs to control the sequencing and the timing of the start of real time operation. In these instances, in addition to having to wait for the completion of the initial condition computation, the user design must also wait for the rest of system to be ready. The system ready signal 257 is used by some embodiments to indicate whether the rest of the system is ready. If the system is ready to proceed with the user design, the process proceeds to 1360. Otherwise, the process 1300 returns to 1340 to wait for the next final initial condition and see if the system is ready.

At 1360, the process allows the user design to proceed by asserting the delay start. Once the delay start is asserted, storage circuits are free to clock in data and begin operation. The process 1300 then ends.

E. Distributed Initialization Sequencers

As mentioned above, an initialization sequencer (such as the sequencer 140 of FIG. 1 and the sequencer 250 of FIG. 2) controls the sequencing of (i) holding the set storage circuits in an initial state while letting the set of logic circuits propagates the initial state of the storage circuits and (ii) releasing the storage circuits from the initial state to start performing the user defined operations when the logic circuits completes propagating the initial state. In some embodiments, one initialization sequencer is sufficient for controlling the delay start of user design execution across the entire IC. However, in some embodiments, different types of circuit blocks are involved in the delay start of user design execution, and these different types of circuit blocks requires different sequencing or control signals in order to correctly propagate the initial conditions.

Figure 14:
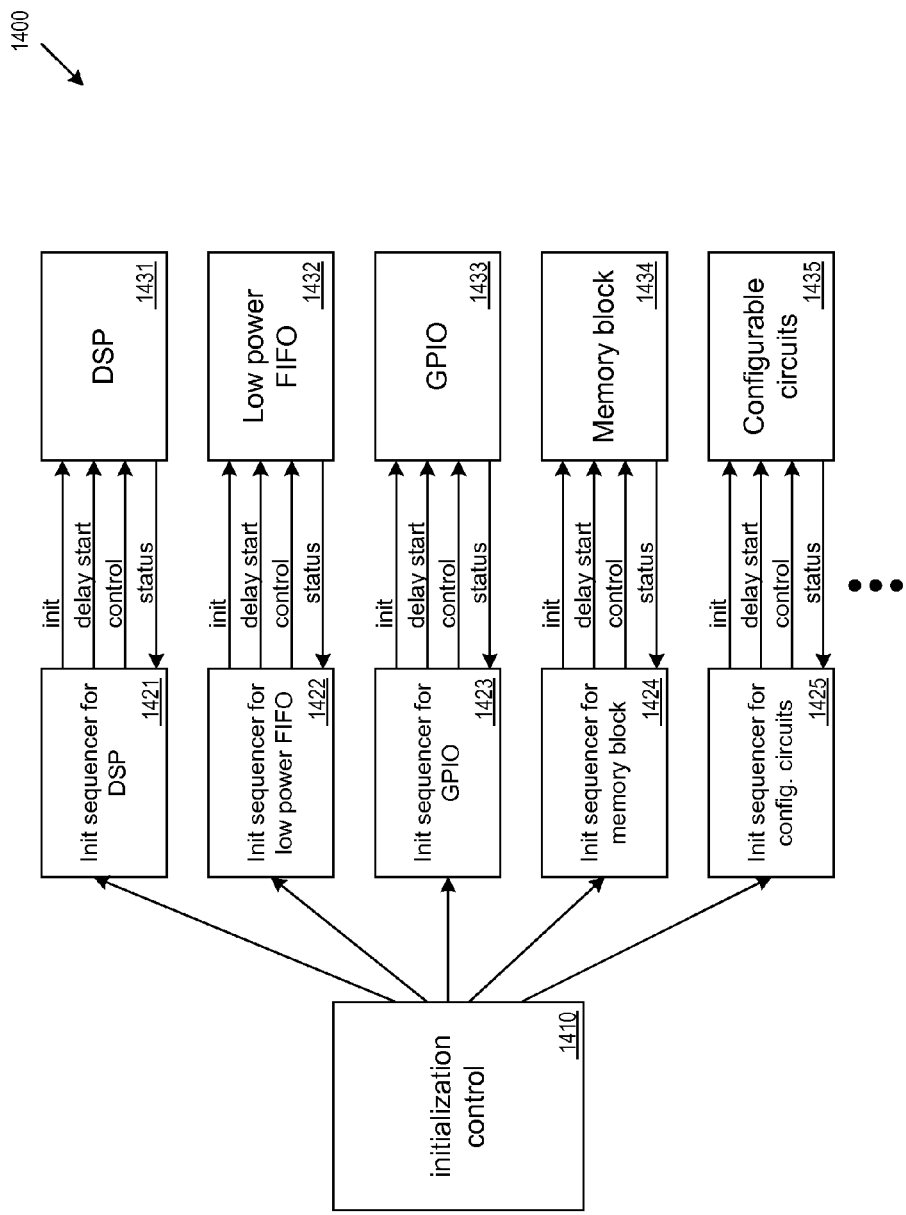
FIG. 14 illustrates an IC in which different initialization sequencers control different circuit blocks.

For example, some embodiments include DSP modules, FIFOs, memory control blocks, I/O control blocks, and other types of circuits. These different types of circuits have storage or state elements that also require delayed start of user design execution in order to correctly propagating initial conditions. However, the control signals of these different blocks of circuits may have different latency requirement, different pipeline delays, or have different handshake protocols, etc. Some embodiments therefore provide different sequencers to different circuit blocks in order to ensure correct sequencing of the control signals. FIG. 14 illustrates an IC 1400 in which different initialization sequencers control different circuit blocks.

As illustrated in FIG. 14, the IC 1400 includes an initialization control module 1410, several initialization sequencers 1421-1425 and several circuit blocks 1431-1435. The initialization control module controls each of the initialization sequencers 1421-1425. Each of the sequencers 1421-1425 in turn produces a set control signals that are tailored to each of the circuit blocks 1431-1435. For example, the sequencer 1425 for the configurable circuits 1435 provides an "init" signal and a "delay start signal", in which the storage circuits are prevented from receiving new data until "delay start" has been asserted as discussed above in Sections I and II.

Other sequencers provide different control signals during initial condition propagation/computation in some embodiments. For example, the sequencer 1424 for the memory block 1434 provides a control signal that prevents write operations to the memory when initial conditions are being propagated in some embodiments. The sequencer 1421 for the DSP module 1431 provides a signal that prevents write operations to a certain data buffers. The sequencer 1423 for the general purpose I/O (GPIO) module 1433 provides a signal for preventing pushes to output of a FIFO inside the GPIO. The sequencer 1422 for the low power FIFO module 1432 provides a signal for forcing certain data paths to be in feedback mode. Some embodiments include other sequencers for other circuit blocks for ensuring the correct propagation of initial conditions. Though not illustrated, the IC in some embodiments includes multiple modules of a same type in different parts of the IC, and each of these different modules has its own initialization sequencer.

The initialization control module provides the "circuit initiation" signals to each of the sequencers 1421-1425. The initialization control module controls the timing of these "circuit initiation" signals in order to coordinate the initial condition propagation across different modules of the IC. In some embodiments, the initialization control module includes a clock management block that also oversees the distribution of clock signals.

IV. Configurable IC Architecture

An IC is a device that includes numerous electronic components (e.g., transistors, resistors, diodes, etc.) that are typically embedded on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

A configurable IC is an integrated circuit that has configurable circuits. A configurable circuit is a circuit that can "configurably" perform a set of operations. Specifically, a configurable circuit receives a configuration data set that specifies the operation that the configurable circuit must perform from the set of operations that it can perform. In some embodiments, configuration data is generated outside of the configurable IC. In these embodiments, a set of software tools typically converts a high-level IC design (e.g., a circuit representation or a hardware description language design) into a set of configuration data bits that can configure the configurable IC (or more accurately, the configurable IC's configurable circuits) to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

A configurable interconnect circuit is a circuit that can configurably connect an input set to an output set in a variety of ways. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in any or all of their interconnect circuits.

The configurable IC of some embodiments includes configurable logic circuits and configurable interconnect circuits for routing the signals to and from the configurable logic circuits. In addition to configurable circuits, a configurable IC also typically includes non-configurable circuits (e.g., non-configurable logic circuits, interconnect circuits, memories, etc.).

Figure 15:
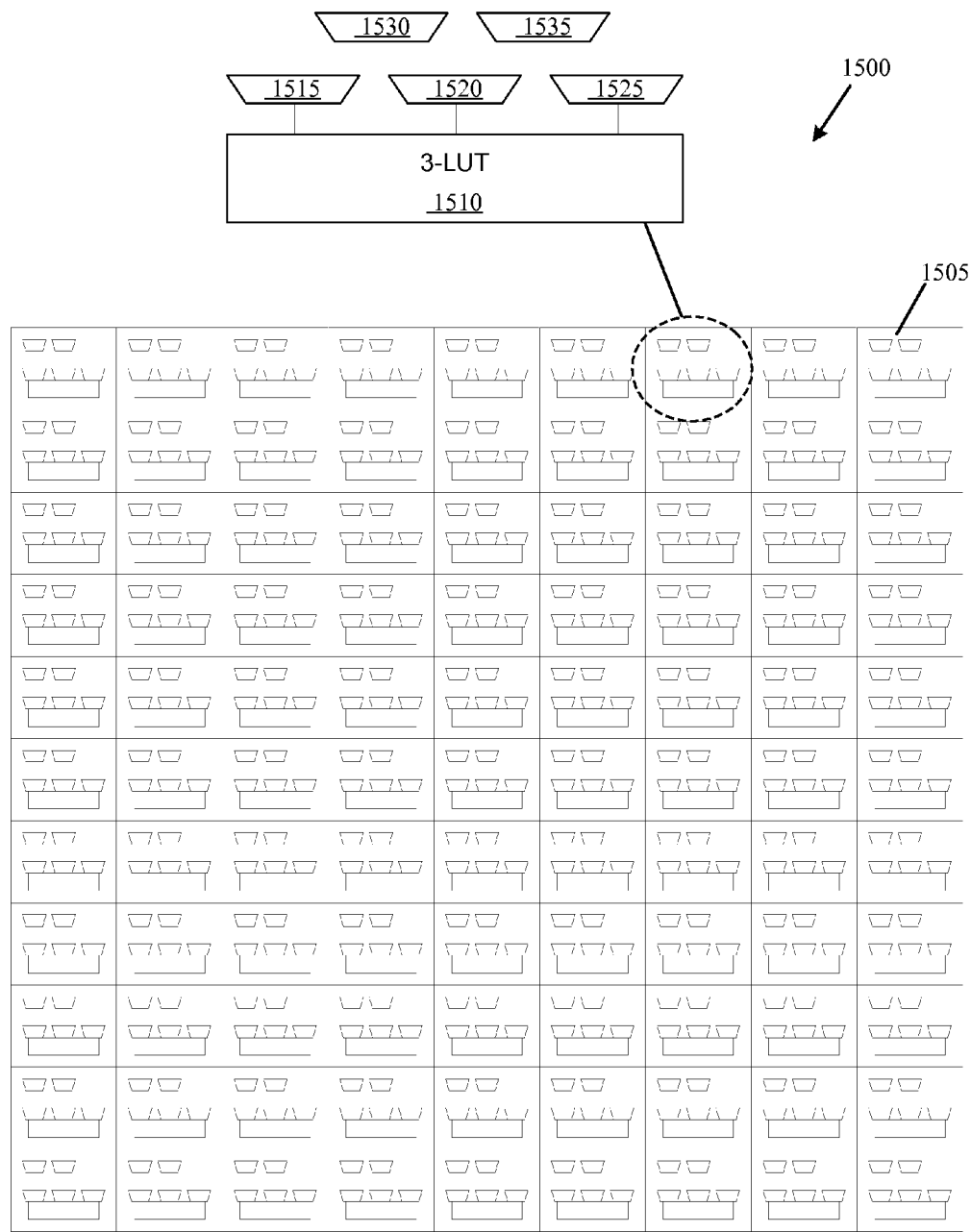
FIGS. 15-17 illustrate several configurable circuit arrangements/architectures that include the invention's circuits.
Figure 16:
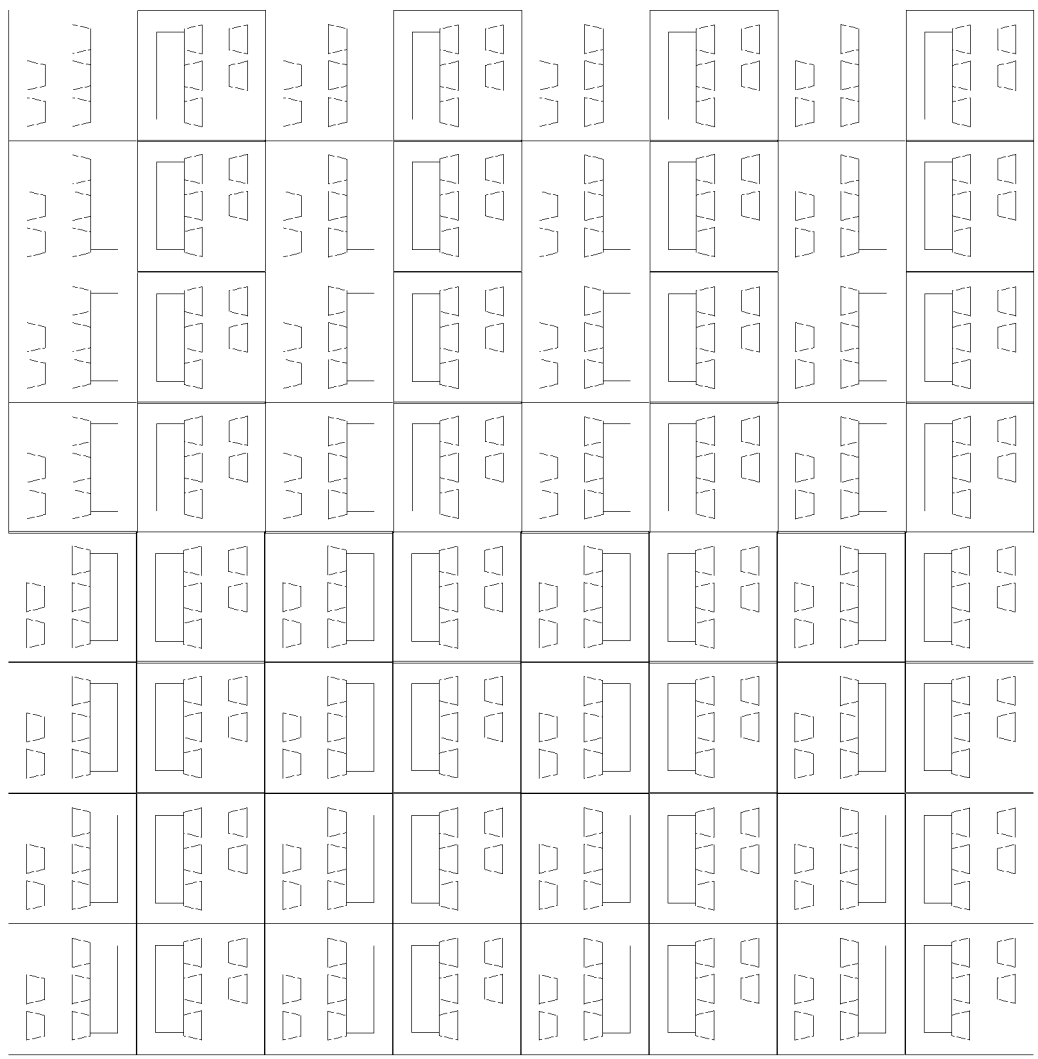
Figure 17:
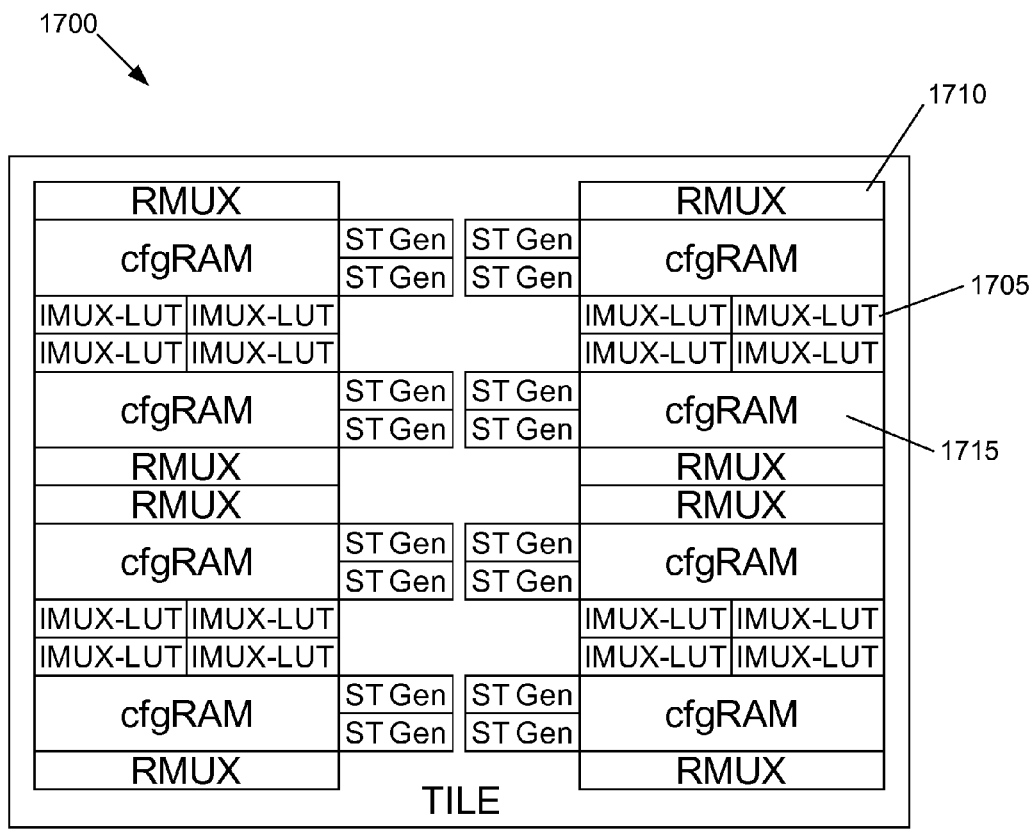

In some embodiments, the configurable circuits might be organized in an arrangement that has all the circuits organized in an array with several aligned rows and columns. In addition, within such a circuit array, some embodiments disperse other circuits (e.g., memory blocks, processors, macro blocks, IP blocks, SERDES controllers, clock management units, etc.). FIGS. 15-17 illustrate several configurable circuit arrangements/architectures that include the invention's circuits. One such architecture is illustrated in FIG. 15.

The architecture of FIG. 15 is formed by numerous configurable tiles 1505 that are arranged in an array with multiple rows and columns. In FIG. 15, each configurable tile includes a configurable three-input LUT 1510, three configurable input-select multiplexers 1515, 1520, and 1525, and two configurable routing multiplexers 1530 and 1535. Different embodiments have different numbers of configurable interconnect circuits 1515-1535. For instance, some embodiments may have eight configurable interconnect circuits while others may have more or less such circuits. For each configurable circuit, the configurable IC 1500 includes a set of storage elements (e.g., a set of SRAM cells) for storing a set of configuration data bits. Storage elements may alternatively be referred to as storage circuits.

In some embodiments, the logic circuits are look-up tables while the interconnect circuits are multiplexers. Also, in some embodiments, the LUTs and the multiplexers are sub-cycle reconfigurable circuits (sub-cycles of reconfigurable circuits may be alternatively referred to as "reconfiguration cycles"). In some of these embodiments, the configurable IC stores multiple sets of configuration data for a sub-cycle reconfigurable circuit, so that the reconfigurable circuit can use a different set of configuration data in different sub-cycles. Other configurable tiles can include other types of circuits, such as memory arrays instead of logic circuits. One such type of configurable tile is a CAM tile, which includes memory arrays and circuits in support of content matching/searching operation based on a given key.

In FIG. 15, an input-select multiplexer (also referred to as an "IMUX") 1515 is an interconnect circuit associated with the LUT 1510 that is in the same tile as the input select multiplexer. One such input select multiplexer receives several input signals for its associated LUT and passes one of these input signals to its associated LUT. In some embodiments, some of the input-select multiplexers are hybrid input-select/logic circuits (referred to as "HMUXs") capable of performing logic operations as well as functioning as input select multiplexers. An HMUX is a multiplexer that can receive "user-design signals" along its select lines.

A user-design signal within a configurable IC is a signal that is generated by a circuit (e.g., logic circuit) of the configurable IC. The word "user" in the term "user-design signal" connotes that the signal is a signal that the configurable IC generates for a particular application that a user has configured the IC to perform. User-design signal is abbreviated to user signal in some of the discussion in this document. In some embodiments, a user signal is not a configuration or clock signal that is generated by or supplied to the configurable IC. In some embodiments, a user signal is a signal that is a function of at least a portion of the set of configuration data received by the configurable IC and at least a portion of the inputs to the configurable IC. In these embodiments, the user signal can also be dependent on (i.e., can also be a function of) the state of the configurable IC. The initial state of a configurable IC is a function of the set of configuration data received by the configurable IC and the inputs to the configurable IC. Subsequent states of the configurable IC are functions of the set of configuration data received by the configurable IC, the inputs to the configurable IC, and the prior states of the configurable IC.

In FIG. 15, a routing multiplexer (also referred to as an RMUX) 1530 is an interconnect circuit that at a macro level connects other logic and/or interconnect circuits. In other words, unlike an input select multiplexer in these figures that only provides its output to a single logic circuit (i.e., that only has a fan out of 1), a routing multiplexer in some embodiments either provides its output to several logic and/or interconnect circuits (i.e., has a fan out greater than 1), or provides its output to at least one other interconnect circuit.

In some embodiments, the RMUXs depicted in FIG. 15 form the routing fabric along with the wire-segments that connect to the RMUXs, and the vias that connect to these wire segments and/or to the RMUXs. In some embodiments, the routing fabric further includes buffers for achieving one or more objectives (e.g., to maintain the signal strength, reduce noise, alter signal delay, etc.) with respect to the signals passing along the wire segments.

Various wiring architectures can be used to connect the RMUXs, IMUXs, and LUTs. Several examples of the wire connection scheme are described in U.S. Pat. No. 7,295,037, entitled "Configurable IC with Routing Circuits with Offset Connections", issued on Nov. 13, 2007.

Several embodiments are described below by reference to a "direct connection." In some embodiments, a direct connection is established through a combination of one or more wire segments, and potentially one or more vias, but no intervening circuit. In some embodiments, a direct connection might, however, include one or more intervening buffer circuits but no other type of intervening circuits. In yet other embodiments, a direct connection might include intervening non-configurable circuits instead of or in conjunction with buffer circuits. In some of these embodiments, the intervening non-configurable circuits include interconnect circuits, while in other embodiments they do not include interconnect circuits.

In the discussion below, two circuits might be described as directly connected. This means that the circuits are connected through a direct connection. Also, some connections are referred to below as configurable connections and some circuits are described as configurably connected. Such references signify that the circuits are connected through a configurable interconnect circuit (such as a configurable routing circuit).

In some embodiments, the examples illustrated in FIG. 15 represent the actual physical architecture of a configurable IC. However, in other embodiments, the examples illustrated in FIG. 15 topologically illustrate the architecture of a configurable IC (i.e., they conceptually show the configurable IC without specifying a particular geometric layout for the position of the circuits).

In some embodiments, the position and orientation of the circuits in the actual physical architecture of a configurable IC are different from the position and orientation of the circuits in the topological architecture of the configurable IC. Accordingly, in these embodiments, the physical architecture of the IC appears quite different than its topological architecture. FIG. 16 provides one such possible physical architecture of the configurable IC 1500 illustrated in FIG. 15.

Having the aligned tile layout with the same circuit elements of FIG. 16 simplifies the process for designing and fabricating the IC, as it allows the same circuit designs and mask patterns to be repetitively used to design and fabricate the IC. In some embodiments, the similar aligned tile layout not only has the same circuit elements but also has the exact same internal wiring between their circuit elements. Having such a layout further simplifies the design and fabrication processes by further simplifying the design and mask making processes.

Some embodiments might organize the configurable circuits in an arrangement that does not have all the circuits organized in an array with several aligned rows and columns. Therefore, some arrangements may have configurable circuits arranged in one or more arrays, while other arrangements may not have the configurable circuits arranged in an array.

Some embodiments might utilize alternative tile structures. For instance, FIG. 17 illustrates an alternative tile structure that is used in some embodiments. This tile 1700 has four sets 1705 of 4-aligned LUTs along with their associated IMUXs. It also includes eight sets 1710 of RMUXs and eight banks 1715 of configuration RAM storage. Each 4-aligned LUT tile shares one carry chain. One example of which is described in U.S. Pat. No. 7,295,037, entitled "Configurable IC with Routing Circuits with Offset Connections", issued on Nov. 13, 2007. One of ordinary skill in the art would appreciate that other organizations of LUT tiles may also be used in conjunction with the invention and that these organizations might have fewer or additional tiles.

V. Reconfigurable IC Architecture

Some embodiments of the invention can be implemented in a reconfigurable integrated circuit that has reconfigurable circuits that reconfigure (i.e., base their operation on different sets of configuration data) one or more times during the operation of the IC. Specifically, reconfigurable ICs are configurable ICs that can reconfigure during runtime. A reconfigurable IC typically includes reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it bases its operation on a different set of configuration data.

A reconfigurable circuit of some embodiments that operates on four sets of configuration data receives its four configuration data sets sequentially in an order that loops from the first configuration data set to the last configuration data set. Such a sequential reconfiguration scheme is referred to as a 4 "loopered" scheme. Other embodiments, however, might be implemented as six or eight loopered sub-cycle reconfigurable circuits. In a six or eight loopered reconfigurable circuit, a reconfigurable circuit receives six or eight configuration data sets in an order that loops from the last configuration data set to the first configuration data set.

Figure 18:
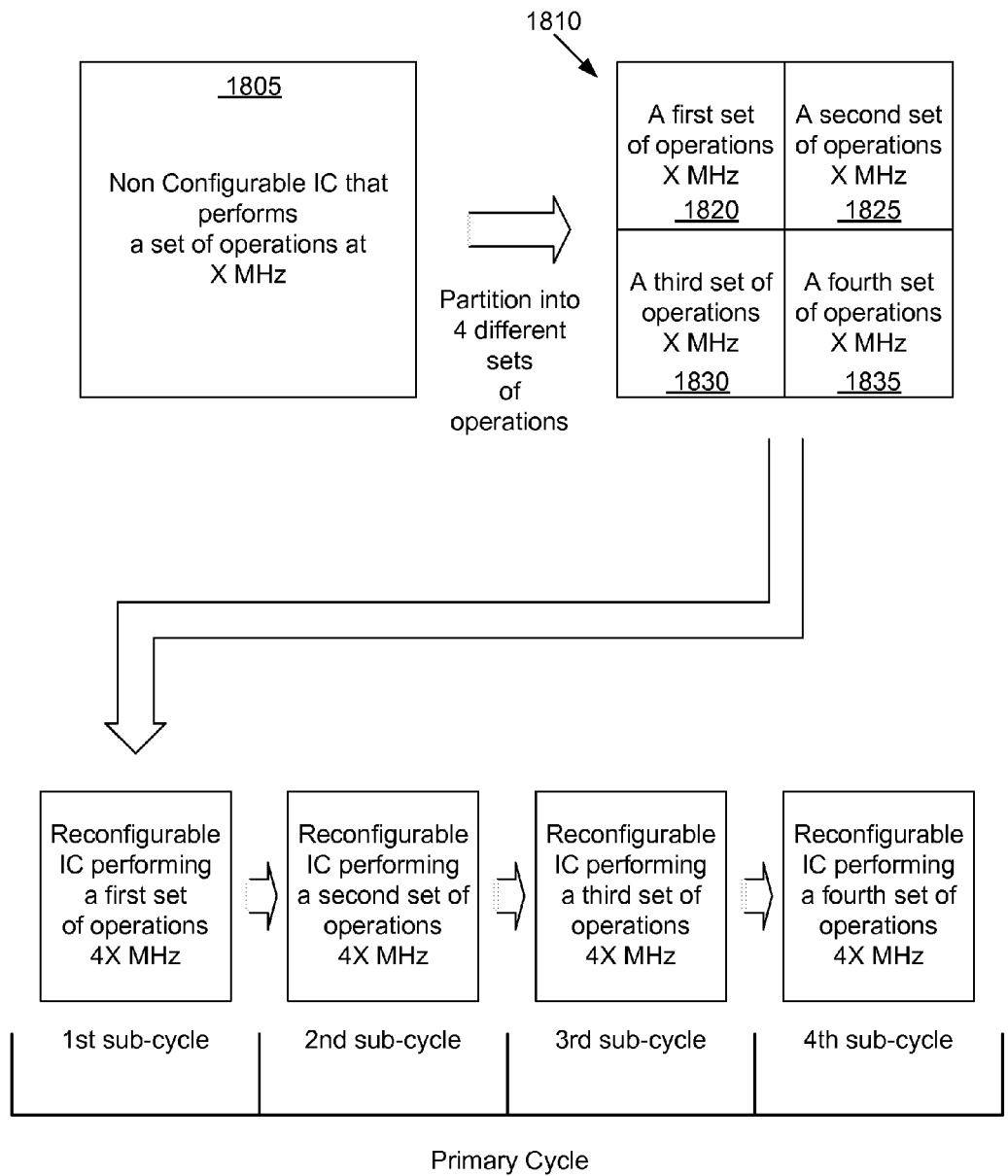
FIG. 18 conceptually illustrates an example of a sub-cycle reconfigurable IC.

FIG. 18 conceptually illustrates an example of a sub-cycle reconfigurable IC (i.e., an IC that is reconfigurable on a sub-cycle basis). In this example, the sub-cycle reconfigurable IC implements an IC design 1805 that operates at a clock speed of X MHz. The operations performed by the components in the IC design 1805 can be partitioned into four sets of operations 1820-1835, with each set of operations being performed at a clock speed of X MHz.

FIG. 18 then illustrates that these four sets of operations 1820-1835 can be performed by one sub-cycle reconfigurable IC 1810 that operates at 4X MHz. In some embodiments, four cycles of the 4X MHz clock correspond to four sub-cycles within a cycle of the X MHz clock. Accordingly, this figure illustrates the reconfigurable IC 1810 reconfiguring four times during four cycles of the 4X MHz clock (i.e., during four sub-cycles of the X MHz clock). During each of these reconfigurations (i.e., during each sub-cycle), the reconfigurable IC 1810 performs one of the identified four sets of operations 1820-1835. In other words, the faster operational speed of the reconfigurable IC 1810 allows this IC to reconfigure four times during each cycle of the X MHz clock, in order to perform the four sets of operations 1820-1835 sequentially at a 4X MHz rate instead of performing the four sets of operations in parallel at an X MHz rate.

Several embodiments were described above by reference to examples of sub-cycle reconfigurable circuits that operate based on four different sets of configuration data. In some of these examples, a reconfigurable circuit receives its four different configuration data sets sequentially in an order that loops from the last configuration data set to the first configuration data set. Such a sequential reconfiguration scheme is referred to as a 4-loopered scheme. Higher order loopered schemes (e.g., 8, 16, 32, etc.,) can likewise be implemented.

For some embodiments, real-time reconfigurable circuits as described above in Sections II and III are used to implement logic circuits (e.g., 215, 225, and 235) that perform logical or arithmetic computations. In some embodiments, reconfigurable circuits are used to implement circuits that serve to control the initial condition computation process such as the as the user design start sequencer 250.

While the reconfigurable circuits described above reconfigure in sub-cycles of a user design clock cycle, one of ordinary skill in the art will understand that in some embodiments, the reconfiguration cycles are not part of a larger user design clock cycle. Accordingly, any features described herein as using sub-cycles can also be implemented in some embodiments with reconfiguration cycles that are not sub-cycles of a longer user design clock cycle. In some such embodiments, multiple reconfigurations of the reconfigurable circuits are performed cyclically based on a reconfiguration clock cycle. In some such embodiments, some reconfigurable circuits reconfigure sequentially through a sequence of configurations over the course of multiple reconfiguration cycles, and then repeat the sequence of configurations multiple times.

VI. Configurable IC and System

Some embodiments described above are implemented in configurable ICs that can compute configurable combinational digital logic functions on signals that are presented on the inputs of the configurable ICs. In some embodiments, such computations are stateless computations (i.e., do not depend on a value of a previous state). Some embodiments described above are implemented in configurable ICs that can perform a continuous function. In these embodiments, the configurable IC can receive a continuous function at its input, and in response, provide a continuous output at one of its outputs.

Figure 19:
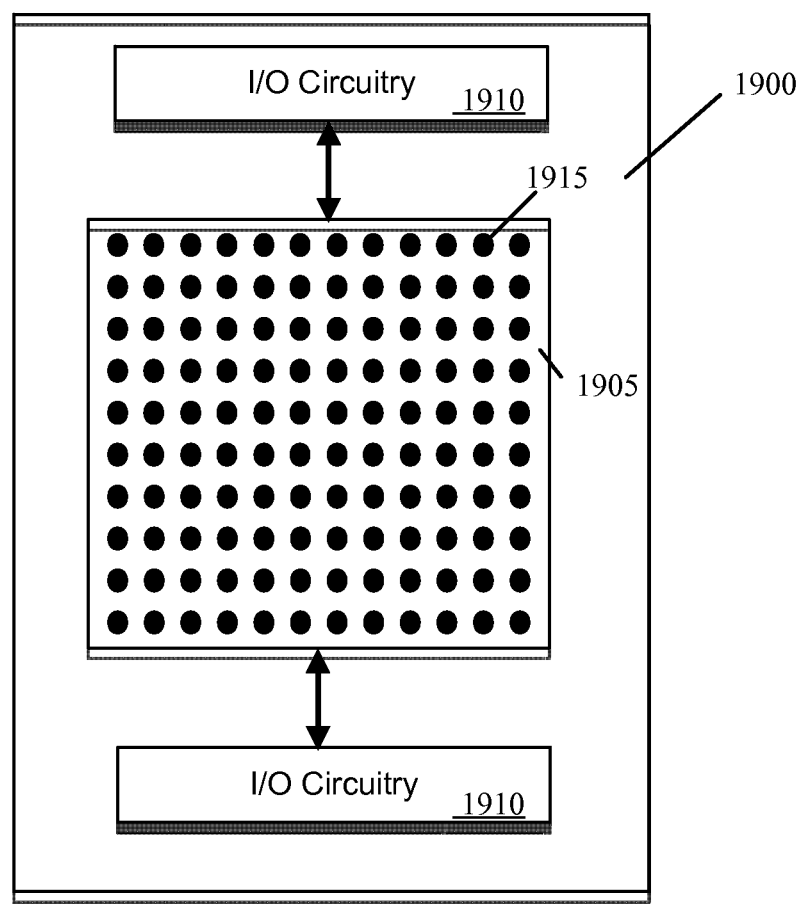
FIG. 19 illustrates a portion of a configurable IC of some embodiments of the invention.

FIG. 19 illustrates a portion of a configurable IC 1900 of some embodiments of the invention. As shown in this figure, this IC has a configurable circuit arrangement 1905 and I/O circuitry 1910. The configurable circuit arrangement 1905 can include any of the above described circuits, storage elements, and routing fabric of some embodiments of the invention. The I/O circuitry 1910 is responsible for routing data between the configurable nodes 1915 of the configurable circuit arrangement 1905 and circuits outside of this arrangement (i.e., circuits outside of the IC, or within the IC but outside of the configurable circuit arrangement 1905). As further described below, such data includes data that needs to be processed or passed along by the configurable nodes.

Figure 20:
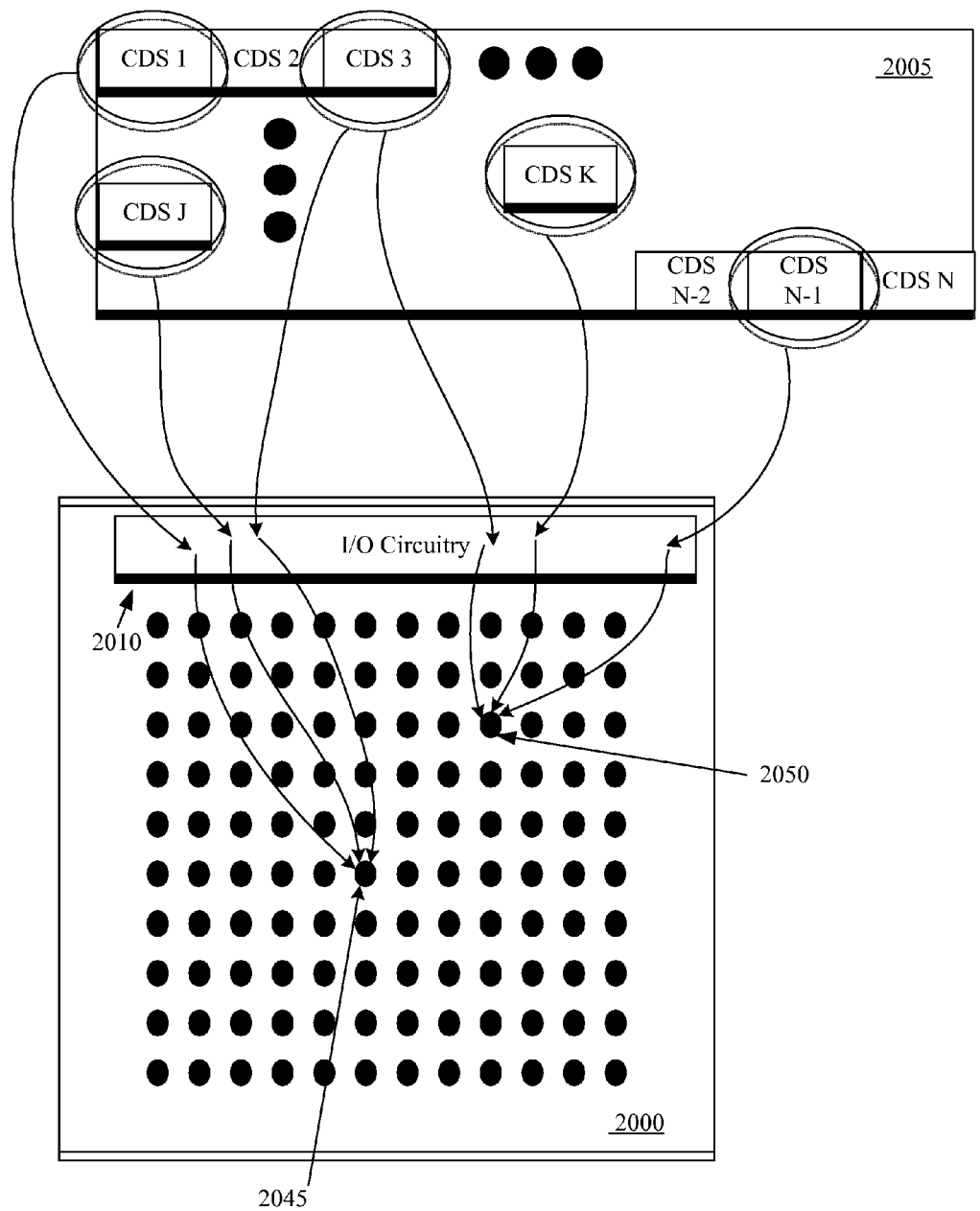
FIG. 20 illustrates a configuration data pool for the configurable IC that includes N configuration data sets ("CDS").

The data also includes, in some embodiments, a set of configuration data for configuring the nodes to perform particular operations. FIG. 20 illustrates a detailed example of this. Specifically, this figure illustrates a configuration data pool 2005 for the configurable IC 2000. This pool includes N configuration data sets ("CDS"). As shown in FIG. 20, the I/O circuitry 2010 of the configurable IC 2000 routes different configuration data sets to different configurable nodes of the IC 2000. For instance, FIG. 20 illustrates configurable node 2045 receiving configuration data sets 1, 3, and J, through the I/O circuitry, while configurable node 2050 receives configuration data sets 3, K, and N−1, through the I/O circuitry. In some embodiments, the configuration data sets are stored within each configurable node. Also, in some embodiments, a configurable node can store multiple configuration data sets for a configurable circuit so that the circuit can reconfigure quickly by changing to another configuration data set for a configurable circuit. In some embodiments, some configurable nodes store only one configuration data set, while other configurable nodes store multiple configuration data sets for a configurable circuit.

Figure 21:
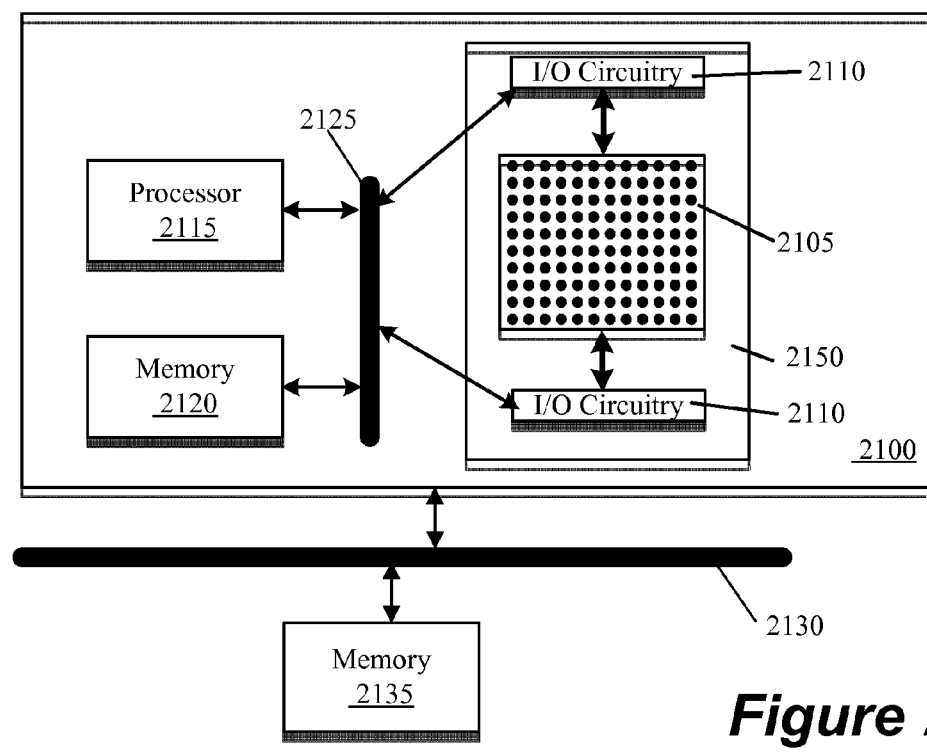
FIG. 21 illustrates a system on a chip ("SoC") implementation of a configurable IC 2100.

A configurable IC of the invention can also include circuits other than a configurable circuit arrangement and I/O circuitry. For instance, FIG. 21 illustrates a system on a chip ("SoC") implementation of a configurable IC 2100. This IC has a configurable block 2150, which includes a configurable circuit arrangement 2105 and I/O circuitry 2110 for this arrangement. It also includes a processor 2115 outside of the configurable circuit arrangement, a memory 2120, and a bus 2125, which conceptually represents all conductive paths between the processor 2115, memory 2120, and the configurable block 2150. As shown in FIG. 21, the IC 2100 couples to a bus 2130, which communicatively couples the IC to other circuits, such as an off-chip memory 2135. Bus 2130 conceptually represents all conductive paths between the system components.

The processor 2115 can read and write instructions and/or data from an on-chip memory 2120 or an off-chip memory 2135. The processor 2115 can also communicate with the configurable block 2150 through memory 2120 and/or 2135 through buses 2125 and/or 2130. Similarly, the configurable block can retrieve data from and supply data to memories 2120 and 2135 through buses 2125 and 2130.

Figure 22:
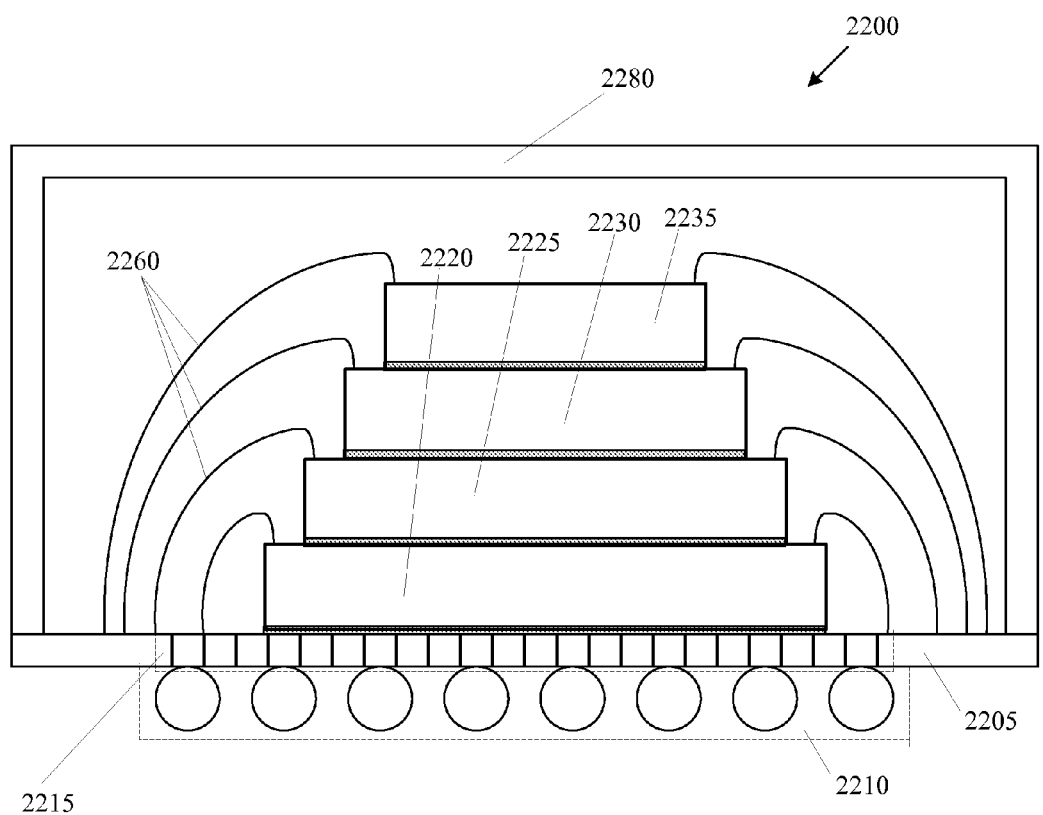
FIG. 22 illustrates a system in a package ("SiP") implementation for a configurable IC.

Instead of, or in conjunction with, the system on a chip ("SoC") implementation for a configurable IC, some embodiments might employ a system in a package ("SiP") implementation for a configurable IC. FIG. 22 illustrates one such SiP 2200. As shown in this figure, SiP 2200 includes four ICs 2220, 2225, 2230, and 2235 that are stacked on top of each other on a substrate 2205. At least one of the ICs is a configurable IC that includes a configurable block, such as the configurable block 2150 of FIG. 21. Other ICs might be other circuits, such as processors, memory, etc.

As shown in FIG. 22, the IC communicatively connects to the substrate 2205 through wire bondings 2260. These wire bondings 2260 allow the ICs 2220-2235 to communicate with each other without having to go outside of the SiP 2200. In some embodiments, the ICs 2220-2235 might be directly wire-bonded to each other in order to facilitate communication between the ICs. Instead of, or in conjunction with the wire bondings 2260, some embodiments might use other mechanisms to communicatively couple the ICs 2220-2235 to each other.

As further shown in FIG. 22, the SiP includes a ball grid array ("BGA") 2210 and a set of vias 2215. The BGA 2210 is a set of solder balls that allows the SiP 2200 to be attached to a printed circuit board ("PCB"). Each via connects a solder ball in the BGA 2210 on the bottom of the substrate 2205, to a conductor on the top of the substrate 2205.

The conductors on the top of the substrate 2205 are electrically coupled to the ICs 2220-2235 through the wire bondings 2260. Accordingly, the ICs 2220-2235 can send and receive signals to and from circuits outside of the SiP 2200 through the wire bondings 2260, the conductors on the top of the substrate 2205, the set of vias 2215, and the BGA 2210. Instead of a BGA, other embodiments might employ other structures (e.g., a pin grid array) to connect a SiP to circuits outside of the SiP. As shown in FIG. 22, a housing 2280 encapsulates the substrate 2205, the BGA 2210, the set of vias 2215, the ICs 2220-2235, and the wire bondings 2260 to form the SiP 2200. This and other SiP structures are further described in U.S. Pat. No. 7,530,044 entitled "Method for Manufacturing a Programmable System In Package".

Figure 23:
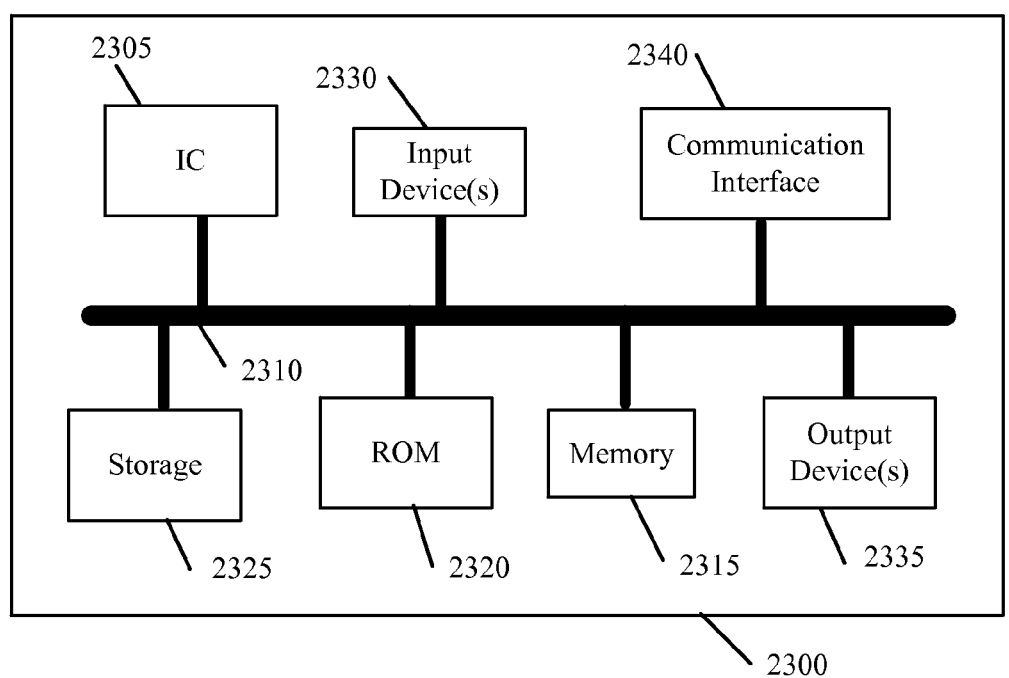
FIG. 23 conceptually illustrates a computing system that has an IC that includes a configurable circuit arrangement with configurable circuits, storage elements, and routing fabric.

FIG. 23 conceptually illustrates a more detailed example of a computing system 2300 that has an IC 2305, which includes a configurable circuit arrangement with configurable circuits, storage elements, and routing fabric of some embodiments of the invention that are described above. The system 2300 can be a stand-alone computing or communication device, or it can be part of another electronic device. As shown in FIG. 23, in addition to the IC 2305, the system 2300 also includes a bus 2310, a system memory 2315, a read-only memory 2320, a storage device 2325, input device(s) 2330, output device(s) 2335, and a communication interface 2340.

The bus 2310 collectively represents all system, peripheral, and chipset interconnects (including bus and non-bus interconnect structures) that communicatively connect the numerous internal devices of the system 2300. For instance, the bus 2310 communicatively connects the IC 2305 with the read-only memory 2320, the system memory 2315, and the permanent storage device 2325. The bus 2310 may be any of several types of bus structures including a memory bus or memory controller, a peripheral bus, and a local bus using any of a variety of conventional bus architectures. For instance, the bus 2310 architecture may include any of the following standard architectures: PCI, PCI-Express, VESA, AGP, Microchannel, ISA and EISA, to name a few.

From these various memory units, the IC 2305 receives data for processing and configuration data for configuring the configurable logic and/or interconnect circuits of the IC. When the IC 2305 has a processor, the IC also retrieves, from the various memory units, instructions to execute. The read-only-memory (ROM) 2320 stores static data and instructions that are needed by the IC 2305 and other modules of the system 2300.

Some embodiments of the invention use a mass-storage device (such as a magnetic disk to read from or write to a removable disk, or an optical disk for reading a CD-ROM disk or to read from or write to other optical media) as the permanent storage device 2325. Other embodiments use a removable storage device (such as a flash memory card or memory stick) as the permanent storage device 2325. The drives and their associated computer-readable media provide non-volatile storage of data, data structures, computer-executable instructions, etc. for the system 2300. Although the description of computer-readable media above refers to a hard disk, a removable magnetic disk, and a CD, it should be appreciated by those skilled in the art that other types of media which are readable by a computer, such as magnetic cassettes, digital video disks, and the like, may also be used in the exemplary operating environment.

Like the storage device 2325, the system memory 2315 is a read-and-write memory device. However, unlike storage device 2325, the system memory is a volatile read-and-write memory, such as a random access memory. Typically, system memory 2315 may be found in the form of random access memory (RAM) modules such as SDRAM, DDR, RDRAM, and DDR-2. The system memory stores some of the sets of instructions and data that the processor needs at runtime.

The bus 2310 also connects to the input and output devices 2330 and 2335. The input devices 2330 enable the user to enter information into the system 2300. The input devices 2330 can include touch-sensitive screens, keys, buttons, keyboards, cursor-controllers, touch screen, joystick, scanner, microphone, etc. The output devices 2335 display the output of the system 2300. The output devices 2335 include printers and display devices, such as cathode ray tubes (CRT), liquid crystal displays (LCD), organic light emitting diodes (OLED), plasma, projection, etc.

Finally, as shown in FIG. 23, bus 2310 also couples system 2300 to other devices through a communication interface 2340. Examples of the communication interface 2340 include network adapters that connect to a network of computers, or wired or wireless transceivers for communicating with other devices. Through the communication interface 2340, the system 2300 can be a part of a network of computers (such as a local area network ("LAN"), a wide area network ("WAN"), or an Intranet) or a network of networks (such as the Internet). The communication interface 2340 may provide such connection using wireless techniques, including digital cellular telephone connection, Cellular Digital Packet Data (CDPD) connection, digital satellite data connection, or the like.

While the invention has been described with reference to numerous specific details, one of ordinary skill in the art will recognize that the invention can be embodied in other specific forms without departing from the spirit of the invention. For example, many of the storage circuits can be used in ICs other than the ones described above, including ICs that do not include configurable circuits (e.g., pure ASICs, processors, etc.). Thus, one of ordinary skill in the art would understand that the invention is not to be limited by the foregoing illustrative details, but rather is to be defined by the appended claims.

What is claimed is:

1. An integrated circuit (IC) for performing user defined operations, the IC comprising:
   a first group of circuits;
   a second group of circuits, wherein the second group of circuits comprises a set of reconfigurable circuits for performing operations by reconfiguring every clock cycle based on different configuration data that are retrieved in different reconfiguration states; and
   a sequencing circuit for (i) holding the first group of circuits in a reset state while the second group of circuits compute a set of initial conditions based on said reset state of the first group of circuits and (ii) releasing the first group of circuits from the reset state to start performing the user defined operations when the second group of circuits completes the computation of the set of initial conditions.

2. The IC of claim 1, wherein the first group of circuits comprises a storage circuit that is initialized to the reset state by a reset signal.

3. The IC of claim 1, wherein the second group of circuits comprises a set of logic circuits for computing a set of outputs based on a set of inputs, wherein the set of inputs is at least partly from the first group of circuits.

4. The IC of claim 3, wherein the set of logic circuits completes the computation of the set of initial condition in a plurality of clock cycles.

5. The IC of claim 4, wherein the sequencer releases the first group of circuits by allowing the first group of circuits to start the user defined operations by storing a final initial condition produced by the second group of circuits at the end of said plurality of clock cycles.

6. The IC of claim 1, wherein the sequencing circuit releases the first group of circuits when the reconfigurable circuits are at a particular reconfiguration state.

7. The IC of claim 1, wherein the reconfiguration states comprises a plurality of sequential states that repeat after a plurality of clock cycles.

8. The IC of claim 1, wherein the first group of circuits starts user defined operations based on a final initial condition produced by the set of reconfigurable circuits when the reconfiguration state is at a terminal count.

9. The IC of claim 1 further comprising a set of intermediate storage elements for storing intermediate computation results of the second group of circuits in every clock cycle, the stored intermediate computation result used for further computation by the second group of circuits in subsequent clock cycles.

10. An electronic device comprising:
a memory device for storing sets of configuration data; and
an integrated circuit (IC) for performing user defined operations, the IC comprising:
 a first group of circuits;
 a second group of circuits for performing logic operations based on the stored sets of configuration data, wherein the second group of circuits comprises a set of reconfigurable circuits for performing operations by reconfiguring every clock cycle based on different configuration data that are retrieved in different reconfiguration states;
 a sequencing circuit for (i) holding the first group of circuits in an initial state while the second group of circuits compute an set of initial conditions based on said initial state of the first group of circuits and (ii) releasing the first group of circuits from the initial state to start performing the user defined operations when the second group of circuits completes the computation of the set of initial conditions.

11. The electronic device of claim 10, wherein the sets of configuration data stored in the memory device specifies the initial state of the set storage circuits.

12. The electronic device of claim 10, wherein the first group of circuits comprises a storage circuit that is initialized to the initial state by a reset signal.

13. The electronic device of claim 10, wherein the second group of circuits comprises a set of logic circuits for computing a set of outputs based on a set of inputs, wherein the set of inputs is at least partly from the first group of circuits.

14. The electronic device of claim 13, wherein the set of logic circuits completes the computation of the set of initial condition in a plurality of clock cycles.

15. The electronic device of claim 14, wherein the sequencer releases the first group of circuits by allowing the first group of circuits to start the user defined operations by storing a final initial condition produced by the second group of circuits at the end of said plurality of clock cycles.

16. The electronic device of claim 10, wherein the sequencing circuit releases the first group of circuits when the reconfigurable circuits are at a particular reconfiguration state.

17. The electronic device of claim 10, wherein the reconfiguration states comprises a plurality of sequential states that repeat after a plurality of clock cycles.

18. The electronic device of claim 10, wherein the first group of circuits starts user defined operations based on a final initial condition produced by the set of reconfigurable circuits when the reconfiguration state is at a terminal count.

19. The IC of claim 10 further comprising a set of intermediate storage elements for storing intermediate computation results of the second group of circuits in every clock cycle, the stored intermediate computation result used for further computation by the second group of circuits in subsequent clock cycles.

20. An integrated circuit (IC) for performing user defined operations, the IC comprising:
 a first group of circuits;
 a second group of circuits;
 a sequencing circuit for (i) holding the first group of circuits in a reset state while the second group of circuits compute a set of initial conditions based on said reset state of the first group of circuits and (ii) releasing the first group of circuits from the reset state to start performing the user defined operations when the second group of circuits completes the computation of the set of initial conditions; and
 a set of intermediate storage elements for storing intermediate computation results of the second group of circuits in every clock cycle, the stored intermediate computation result used for further computation by the second group of circuits in subsequent clock cycles.

\* \* \* \* \*